(12) United States Patent
Chestakov et al.

(10) Patent No.: US 9,810,826 B2
(45) Date of Patent: Nov. 7, 2017

(54) LIGHT EMITTING DEVICE

(71) Applicant: PHILIPS LIGHTING HOLDING B.V., Eindhoven (NL)

(72) Inventors: Dmitri Anatolievich Chestakov, Eindhoven (NL); Rifat Ata Mustafa Hikmet, Eindhoven (NL); Stefan Willi Julius Gruhlke, Eindhoven (NL); Ties Van Bommel, Eindhoven (NL); Albert Bijlsma, Eindhoven (NL); Dirk Kornelis Gerhardus De Boer, Eindhoven (NL); Gerardus Everardus Marie Hannen, Eindhoven (NL); Hendrik Jan Eggink, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/113,759

(22) PCT Filed: Jan. 27, 2015

(86) PCT No.: PCT/EP2015/051633
§ 371 (c)(1),
(2) Date: Jul. 22, 2016

(87) PCT Pub. No.: WO2015/113979
PCT Pub. Date: Aug. 6, 2015

(65) Prior Publication Data
US 2016/0377785 A1    Dec. 29, 2016

(30) Foreign Application Priority Data

Jan. 28, 2014 (EP) .................................... 14152898

(51) Int. Cl.
*F21V 8/00* (2006.01)
*G02B 19/00* (2006.01)
(Continued)

(52) U.S. Cl.
CPC .......... *G02B 6/0003* (2013.01); *F21S 48/115* (2013.01); *F21S 48/1145* (2013.01);
(Continued)

(58) Field of Classification Search
None
See application file for complete search history.

(56) References Cited

U.S. PATENT DOCUMENTS

2007/0152230 A1    7/2007  Duong et al.
2007/0279914 A1   12/2007  Rutherford et al.
(Continued)

FOREIGN PATENT DOCUMENTS

EP          2346101 A1      7/2011
JP       2009217997 A       9/2009
WO    WO2010044240 A1       4/2010

*Primary Examiner* — Kristy A Haupt

(57) ABSTRACT

A light emitting device (1) comprising at least one light source (2) adapted for, in operation, emitting first light (13) with a first spectral distribution, a light guide (4) made of a luminescent material and comprising a light input surface (41) and a light exit surface (42) extending in an angle different from zero to one another, the light guide further comprising a first further surface (46) extending parallel to and arranged opposite to the light exit surface, wherein the light guide is adapted for receiving the first light (13) with the first spectral distribution at the light input surface, converting at least a part of the first light with the first spectral distribution to second light (14) with a second spectral distribution, guiding the second light with the second spectral distribution to the light exit surface and coupling the second light with the second spectral distribution out of the light exit surface. The light emitting device further comprises a phosphor element (77) arranged adjacent to the first further surface and a reflective element (76) arranged adjacent the phosphor element opposite to the first further surface (46). The phosphor element is adapted for
(Continued)

converting light incident from the light guide to third light (17) with a third spectral distribution and the light guide (40) is furthermore adapted for receiving the third light (17) with the third spectral distribution at the first further surface (46), guiding the third light (46) with the third spectral distribution to the light exit surface (42) and coupling the third light with the third spectral distribution out of the light exit surface.

15 Claims, 10 Drawing Sheets

(51) Int. Cl.
   *G03B 21/16* (2006.01)
   *H01L 33/50* (2010.01)
   *F21S 8/10* (2006.01)
   *G03B 21/20* (2006.01)
   *H01L 33/60* (2010.01)
   *H01L 33/64* (2010.01)

(52) U.S. Cl.
   CPC ......... *F21S 48/1241* (2013.01); *F21S 48/214* (2013.01); *F21S 48/215* (2013.01); *F21S 48/2243* (2013.01); *G02B 6/005* (2013.01); *G02B 6/0031* (2013.01); *G02B 6/0046* (2013.01); *G02B 6/0085* (2013.01); *G02B 19/0019* (2013.01); *G02B 19/0066* (2013.01); *G03B 21/16* (2013.01); *G03B 21/204* (2013.01); *G03B 21/208* (2013.01); *G03B 21/2013* (2013.01); *H01L 33/502* (2013.01); *H01L 33/504* (2013.01); *H01L 33/505* (2013.01); *H01L 33/60* (2013.01); *H01L 33/642* (2013.01)

(56) References Cited

U.S. PATENT DOCUMENTS

| | | |
|---|---|---|
| 2007/0280622 A1 | 12/2007 | Rutherford |
| 2008/0079910 A1* | 4/2008 | Rutherford ........ G03B 21/2013 353/84 |
| 2008/0191236 A1 | 8/2008 | De Graaf et al. |
| 2009/0078949 A1 | 3/2009 | Bechtel et al. |
| 2009/0161341 A1* | 6/2009 | Meir .................... G02B 6/0041 362/84 |
| 2009/0244923 A1 | 10/2009 | Hofmann et al. |
| 2011/0018020 A1 | 1/2011 | Jagt |
| 2012/0212931 A1 | 8/2012 | Kinoshita et al. |
| 2013/0039029 A1 | 2/2013 | Wang et al. |

* cited by examiner

LIGHT EMITTING DEVICE

CROSS-REFERENCE TO PRIOR APPLICATIONS

This application is the U.S. National Phase application under 35 U.S.C. §371 of International Application No. PCT/EP2015/051633, filed on Jan. 27, 2015, which claims the benefit of European Patent Application No. 14152898.4, filed on Jan. 28, 2014. These applications are hereby incorporated by reference herein.

FIELD OF THE INVENTION

The invention relates to a light emitting device comprising a light source adapted for, in operation, emitting light with a first spectral distribution and a light guide adapted for converting the light with the first spectral distribution to light with a second spectral distribution.

BACKGROUND OF THE INVENTION

High intensity light sources, and particularly white high intensity light sources, are interesting for various applications including spots, headlamps, stage-lighting and digital light projection. For such purposes, it is possible to make use of so-called luminescent concentrators in which shorter wavelength light is converted to longer wavelengths in a highly transparent luminescent material. Such a transparent luminescent material is illuminated by LEDs to produce longer wavelengths within the luminescent material. Converted light, which will be waveguided in the luminescent material, is extracted from a surface leading to an intensity gain or, in other words, an increase in brightness.

When using such a high intensity light source for RGB light generation, e.g. in beamers, recent developments suggest a light emitting device employing step-by-step light conversion from blue LED light to green light or via green light to red light, for instance by means of phosphor-based conversion. This requires a very small etendue, a very high luminance and a high efficiency which in turn results in the design of a very compact light source with an electrical input power of more than 10-60 W. Under such conditions substantial amounts of heat are generated, which results in adverse effects on especially the etendue and efficiency.

Such a light emitting device may be built in such a way that the components are arranged in the sequence of, as seen in the direction of propagation of the light, a blue LED, a green luminescent rod, a red phosphor and an optical lens. The red phosphor is attached, e.g. glued, between the green luminescent rod and the optical lens.

Document US 2013/0039029 A1 describes a light engine with a similar construction and built in such a way that the components are arranged in the sequence of, as seen in the direction of propagation of the light through the light emitting device, a light source, a light guide, an optical element and a luminescent element. Furthermore, an optical element is also arranged between the light source and the light guide.

In both prior art devices described above, the optical quality of the red phosphor, which should be transparent and non-scattering, and the mechanical reliability of the glue used, which should be capable of holding few elements at high temperature gradient conditions, are critical. As a result a high quality red phosphor material and high quality thermally stable glue are required, which increases the costs and limits the system reliability.

US2008/0079910A1 discloses an illumination system that includes a body containing a fluorescent material that emits light in a second wavelength range, when illuminated by light of a first wavelength range. The system further includes at least a second fluorescent material that absorbs light in at least one of the first and second wavelength ranges, and emits light in a third wavelength range. The body has an extraction area, and at least some of the light in either the second or third wavelength ranges is internally reflected within the body to the extraction area.

SUMMARY OF THE INVENTION

It is an object of the present invention to overcome this problem, and to provide a light emitting device with an increased reliability and durability and which is cheaper to manufacture.

According to a first aspect of the invention, this and other objects are achieved by means of a light emitting device comprising at least one light source adapted for, in operation, emitting first light with a first spectral distribution, a light guide comprising a light input surface and a light exit surface extending in an angle different from zero to one another, the light guide further comprising a first further surface extending parallel to and arranged opposite to the light exit surface, the light guide being adapted for receiving the first light with the first spectral distribution at the light input surface, converting at least a part of the first light with the first spectral distribution to second light with a second spectral distribution, guiding the second light with the second spectral distribution to the light exit surface and coupling the second light with the second spectral distribution out of the light exit surface, the light guide being made of a luminescent material, the light emitting device further comprising a phosphor element arranged adjacent to the first further surface, the phosphor element being adapted for converting light incident from the light guide to third light with a third spectral distribution, the light guide furthermore being adapted for receiving the third light with the third spectral distribution at the first further surface, guiding the third light with the third spectral distribution to the light exit surface and coupling the third light with the third spectral distribution out of the light exit surface, and the light emitting device further comprising a reflective element arranged adjacent the phosphor element opposite to the first further surface of the light guide.

By providing a light emitting device with a light guide being adapted for converting at least a part of the incoupled light to converted light with a different spectral distribution, a light guide is provided with which a particularly large amount of the converted light will stay in the light guide which can subsequently be extracted from one of the surfaces, which in turn leads to a particularly high intensity gain.

By providing the light input surface and the light exit surface extending in an angle different from zero to one another a light emitting device is provided which has a particularly simple geometry and which is very simple and fast to produce and to align properly with the light sources. In an embodiment the light input surface and the light exit surface extend perpendicular to one another.

In embodiments the light guide is made of a garnet. Garnets show high photochemical stability and thus provide for a particularly durable light emitting device.

By providing a phosphor element arranged adjacent to the first further surface of the light guide, the phosphor element being adapted for converting incident light to third light with a third spectral distribution and by providing a reflective element arranged adjacent the phosphor element opposite to the first further surface of the light guide, the incident light passes through the phosphor element twice, once before being reflected off the reflective element and once after. The phosphor element is thus provided in between the reflective element and the first further surface of the light guide. Therefore, the phosphor element may be made considerably thinner, particularly about two times thinner, as compared to the prior art devices described above. Thereby the acceptable minimum optical quality of the phosphor element is lowered, without compromising the quality of the light conversion effect of the phosphor element. Furthermore, the thinner the phosphor element, the lower the internal temperature gradients in the phosphor element become, which in turn results in lower mechanical stress in the transition layer between the phosphor element and the light guide and/or in the layer bonding the phosphor element and the light guide together.

By adapting the light guide for receiving the third light with the third spectral distribution at the first further surface, guiding the third light with the third spectral distribution to the light exit surface and coupling the third light with the third spectral distribution out of the light exit surface a light emitting device is obtained with which light with a broader spectral distribution, i.e. at least with the second and third spectral distribution, may be emitted without compromising the brightness of the light. In this way an RGB light source or a white light source with light having a relatively high power and high concentration as well as a low etendue is provided.

Furthermore this configuration allows for a light emitting device emitting light with a wider spectral distribution, which in turn enables provision of white light of an improved quality.

Furthermore, the provision of a reflective element also improves the efficiency and the intensity of the light output by reducing the amount of light escaping from the light guide through other surfaces than the light exit surface. According to an embodiment, the reflective element is any one or more of a mirror plate, a mirror foil and a mirror coating.

In an embodiment a gap is provided between the phosphor element and the light guide. In a further embodiment an optical element is provided in between the phosphor element and the light guide. In embodiments the optical element is separated by a gap from the phosphor element and/or separated by a gap from the light guide. In embodiments the phosphor element is arranged on a reflective heat sink element. In other embodiments the reflective element is arranged on a heat sink element and the phosphor element is arranged on the reflective element.

By separating the phosphor element from the light guide by a gap, the transfer of heat from the phosphor element to the light guide and vice versa is reduced, thereby improving the thermal management of the light emitting device, resulting in a reduction of the heat created in the light guide and/or the phosphor element.

In an embodiment the light emitting device further comprises an optical element arranged at the light exit surface.

In embodiments of a light emitting device according to the invention adapted for providing white light, the optical element is a lens, such as a convex lens, a concave lens or even an array of lenses. Alternatively the optical element may e.g. be a grating, a filter, a surface structure or the like. The optical element may comprise an optical element that selectively reflects a predetermined spectral distribution or wavelength range, for example a dichroic filter provided at the light exit surface of the light guide or a dichroic filter provided at a light exit surface of another optical element such as a compound parabolic concentrator. In this way a more efficient wavelength conversion by the phosphor element may be provided for by selectively reflecting a predetermined spectral distribution or wavelength range which is not converted by the phosphor element to third light with the third spectral distribution such that more light is converted by the phosphor element to third light, because the light reflected by the dichroic filter will be guided via the light guide to and received at the phosphor element and thus may be converted to third light with the third spectral distribution. For example, in case of a red phosphor element, green and/or yellow light may be reflected by the selectively reflective optical element and may thus be guided via the light guide to the red phosphor element where it may be converted at least partly to red light thereby providing more a more efficient conversion to red light.

Thereby a light emitting device is provided with which the light emitted from the light exit surface of the light guide may be shaped and/or mixed such as to provide a light output which has an even higher quality and which may be adapted for a specific application. Furthermore, the optical element may for at least some embodiments also improve the coupling of light out of the light exit surface thereby improving the intensity of the light output. Particularly, in case the optical element comprises a lens or an array of lenses an improved overlapping of components or beams of the light output having different spectral distributions may be obtained, thus providing a light output of a higher quality.

In an embodiment the phosphor element comprises a thickness between 0.1 mm and 1 cm. The thickness of the phosphor element is in this connection defined as the shortest distance between and perpendicular to both of the surface of the phosphor element adjacent to the first further surface and the surface of the phosphor element adjacent to the reflective element. Such a phosphor element has been shown to have a thickness providing a particularly good compromise between the desire for a high quality of the light conversion effect of the phosphor element and the desire for lowering the temperature gradients in the phosphor element as much as possible.

In an embodiment the phosphor element and the reflective element are glued, coated or deposited onto the first further surface and the phosphor element, respectively. In case of a glue, which is generally the simplest and least costly and thus preferred bonding method or material, the thinner phosphor element, made possible with the light emitting device according to the invention, provides for lower internal temperature gradients in the phosphor element which in turn results in lower mechanical stress in the respective layers of glue. Furthermore, with a thinner phosphor element less weight must be supported by the glue, or for that matter any other bonding material. Thereby a light emitting device having a longer life and thus higher durability is provided.

In case of bonding by coating or depositing the same effect is obtained with respect to the respective transition layers between the reflective element, the phosphor element and the light guide.

In an embodiment the light emitting device further comprises at least two phosphor elements arranged between the first reflective element and the first further surface. Thereby a light emitting device is obtained with which it becomes possible to provide a light output comprising a larger number of light components with different spectral distributions.

In an embodiment a first heat sink element is provided adjacent to the reflective element opposite to the phosphor element by which a considerable improvement in the dissipation of heat away from the light guide and in particular from the phosphor element and the reflective element is obtained. This in turn provides for enabling operation at higher maximum optical powers without loss of lifetime and for an improved conversion efficiency of the phosphor element, thereby raising the maximum obtainable output light intensity of the light emitting device considerably. Furthermore, the adverse effects on the optical performance due to e.g. thermal quenching are lowered significantly or even eliminated, which provides for a considerably more reliable light emitting device with an improved optical performance especially in terms of an improved etendue and efficiency.

In an embodiment the first heat sink element is any one or more of a passively cooled heat sink element, a liquid cooled heat sink element, a heat sink element comprising one or more fins and a heat sink element forming an outer wall of the light emitting device.

All of these embodiments provide for a further improved cooling effect, and thus for a light emitting device with a heat sink element providing a particularly efficient cooling, especially of the phosphor element and of the reflective element.

The first heat sink element may be arranged in direct contact with the reflective element or may be glued onto the reflective element or may be arranged such that a gap is provided between the first heat sink element and the reflective element.

In an embodiment a second heat sink element is provided on the optical element. In addition to providing effects similar to those described above in relation to the first heat sink element, the provision of a heat sink element on the optical element provides for direct cooling of the optical element and thus for a higher efficiency of the optical element.

In an embodiment the second heat sink element is any one or more of a passively cooled heat sink element, a liquid cooled heat sink element, a heat sink element comprising one or more fins and a heat sink element comprising a light reflective layer or coating.

All of these embodiments provide for an improved cooling effect, and thus for a light emitting device with a heat sink element providing a particularly efficient cooling especially of the optical element.

In an embodiment the phosphor element is adapted for converting incident light to third light with a third spectral distribution being in the wavelength range of 590 to 850 nm.

In an embodiment the first light guide is adapted for converting at least a part of the first light with the first spectral distribution to second light with a second spectral distribution being in the wavelength range of 495 to 590 nm.

In an embodiment the at least one light source is a LED, laser diode or OLED emitting light with a first spectral distribution in the wavelength range of 350-550 nm.

By any of these embodiments a light emitting device is provided which is particularly suitable for providing a white light output of a high quality and intensity. Combining two or all three of these three embodiments a white light output of a particularly high quality and intensity may be obtained.

The invention further relates to a lamp, a luminaire, or a lighting system comprising a light emitting device according to the invention, the lamp, luminaire and system being used in one or more of the following applications: digital projection, automotive lighting, stage lighting shop lighting, home lighting, accent lighting, spot lighting, theater lighting, fiber optic lighting, display systems, warning lighting systems, medical lighting applications, decorative lighting applications.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

Figure 1:
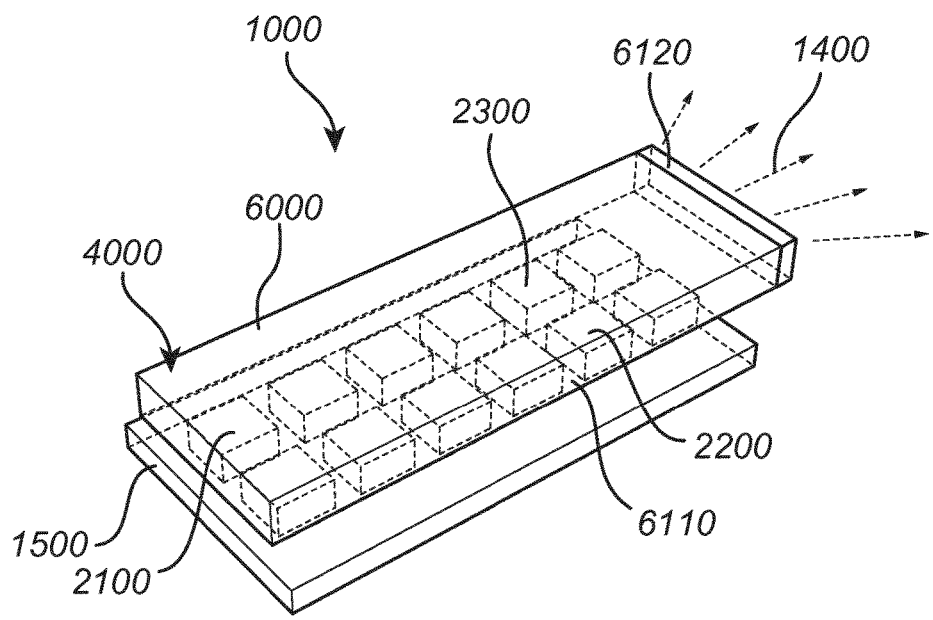
FIG. 1 shows a 3-dimensional perspective view of a light emitting device comprising an exit phosphor.

As illustrated in the figures, the sizes of layers, elements and regions are exaggerated for illustrative purposes and, thus, are provided to illustrate the general structures of embodiments of the present invention. Like reference numerals refer to like elements throughout, such that e.g. a light emitting device according to the invention is generally denoted 1, whereas different specific embodiments thereof are denoted by adding 01, 02, 03 and so forth to the general reference numeral. With regard to FIGS. 1 to 8 showing a number of features and elements which may be added to any one of the embodiments of a light emitting device according to the invention, "00" has been added to all elements except those specific to one of these Figures.

DETAILED DESCRIPTION

The present invention will now be described more fully hereinafter with reference to the accompanying drawings, in which embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The following description will start with general considerations regarding applications, suitable light sources and suitable materials for various elements and features of a light emitting device according to the invention. For this purpose a number of features and elements which may be added to any one of the embodiments of a light emitting device according to the invention as set forth further below will be described with reference to FIGS. 1 to 8. The specific embodiments of a light emitting device according to the invention will be described in detail with reference to FIGS. 9 to 17.

A light emitting device according to the invention may be used in applications including but not being limited to a lamp, a light module, a luminaire, a spot light, a flash light, a projector, a digital projection device, automotive lighting such as e.g. a headlight or a taillight of a motor vehicle, arena lighting, theater lighting and architectural lighting.

Light sources which are part of the embodiments according to the invention as set forth below, are adapted for, in operation, emitting light with a first spectral distribution. This light is subsequently coupled into a light guide or waveguide. The light guide or waveguide may convert the light of the first spectral distribution to another spectral distribution and guides the light to an exit surface. The light source may in principle be any type of point light source, but is in an embodiment a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs, or a combination of any of these. The LED may in principle be an LED of any color, or a combination of these, but is in an embodiment a blue light source producing light source light in the blue color-range which is defined as a wavelength range of between 380 nm and 495 nm. In another embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

The light source may be a red light source, i.e. emitting in a wavelength range of e.g. between 600 nm and 800 nm. Such a red light source may be e.g. a light source of any of the above mentioned types directly emitting red light or provided with a phosphor suitable for converting the light source light to red light. This embodiment is particularly advantageous in combination with a light guide adapted for converting the light source light to infrared (IR) light, i.e. light with a wavelength of more than about 800 nm and in a suitable embodiment with a peak intensity in the range from 810 to 850 nm. In an embodiment such a light guide comprises an IR emitting phosphor. A light emitting device with these characteristics is especially advantageous for use in night vision systems, but may also be used in any of the applications mentioned above.

Another example is combination of a first, red light source emitting light in a wavelength range between 480 nm and 800 nm and coupling this light into a luminescent rod or waveguide, and a second light source, emitting blue or UV or violet light, i.e. with a wavelength smaller than 480 nm, and also coupling its emitted light into the luminescent waveguide or rod. The light of the second light source is converted by the luminescent waveguide or rod to a wavelength range between 480 nm and 800 nm, and the light of the first light source coupled into the luminescent waveguide or rod will not be converted. In other words, the second light source emits UV, violet or blue light and is subsequently converted by the luminescent concentrator into light in the green-yellow-orange-red spectral region. In another embodiment the first light source emits in a wavelength range between 500 nm and 600 nm, and the light of the second light source is converted by the luminescent waveguide or rod to a wavelength range between 500 nm and 600 nm. In another embodiment the first light source emits in a wavelength range between 600 nm and 750 nm, and the light of the second light source is converted by the luminescent waveguide or rod to a wavelength range between 600 nm and 750 nm. In an embodiment the light of the first light source is coupled into the luminescent waveguide or rod at another surface, for example a surface opposite to an exit surface of the light, than a surface where the light of the second light source is coupled into the luminescent waveguide or rod. These embodiments provide a luminescent waveguide or rod emitting in the red light range with an increased brightness.

The light guides as set forth below in embodiments according to the invention generally may be rod shaped or bar shaped light guides comprising a height H, a width W, and a length L extending in mutually perpendicular directions and are in embodiments transparent, or transparent and luminescent. The light is guided generally in the length L direction. The height H is in embodiments <10 mm, in other embodiments <5 mm, in yet other embodiments <2 mm. The width W is in embodiments <10 mm, in other embodiments <5 mm, in yet embodiments <2 mm. The length L is in embodiments larger than the width W and the height H, in other embodiments at least 2 times the width W or 2 times the height H, in yet other embodiments at least 3 times the width W or 3 times the height H. The aspect ratio of the height H:width W is typically 1:1 (for e.g. general light source applications) or 1:2, 1:3 or 1:4 (for e.g. special light source applications such as headlamps) or 4:3, 16:10, 16:9 or 256:135 (for e.g. display applications). The light guides generally comprise a light input surface and a light exit surface which are not arranged in parallel planes, and in embodiments the light input surface is perpendicular to the light exit surface. In order to achieve a high brightness, concentrated, light output, the area of light exit surface may be smaller than the area of the light input surface. The light exit surface can have any shape, but is in an embodiment shaped as a square, rectangle, round, oval, triangle, pentagon, or hexagon.

Transparent light guides may in embodiments comprise a transparent substrate on which a plurality of light sources, for example LEDs, are grown epitaxially. The substrate is in embodiments a single crystal substrate, such as for example a sapphire substrate. The transparent growth substrate of the light sources is in these embodiments the light concentrating light guide.

The generally rod shaped or bar shaped light guide can have any cross sectional shape, but in embodiments has a cross section the shape of a square, rectangle, round, oval, triangle, pentagon, or hexagon. Generally the light guides are cuboid, but may be provided with a different shape than a cuboid, with the light input surface having somewhat the shape of a trapezoid. By doing so, the light flux may be even enhanced, which may be advantageous for some applications.

The light guides may also be cylindrically shaped rods. In embodiments the cylindrically shaped rods have one flattened surface along the longitudinal direction of the rod and at which the light sources may be positioned for efficient incoupling of light emitted by the light sources into the light guide. The flattened surface may also be used for placing heat sinks. The cylindrical light guide may also have two flattened surfaces, for example located opposite to each other or positioned perpendicular to each other. In embodiments the flattened surface extends along a part of the longitudinal direction of the cylindrical rod.

The light guides as set forth below in embodiments according to the invention may also be folded, bended and/or shaped in the length direction such that the light guide is not a straight, linear bar or rod, but may comprise, for example, a rounded corner in the form of a 90 or 180 degrees bend, a U-shape, a circular or elliptical shape, a loop or a 3-dimensional spiral shape having multiple loops. This provides for a compact light guide of which the total length, along which generally the light is guided, is relatively large, leading to a relatively high lumen output, but can at the same time be arranged into a relatively small space. For example luminescent parts of the light guide may be rigid while transparent parts of the light guide are flexible to provide for the shaping of the light guide along its length direction. The light sources may be placed anywhere along the length of the folded, bended and/or shaped light guide.

Suitable materials for the light guides as set forth below according to embodiments of the invention are sapphire, polycrystalline alumina and/or undoped transparent garnets such as YAG, LuAG having a refractive index of n=1.7. An additional advantage of this material (above e.g. glass) is that it has a good thermal conductivity, thus diminishing local heating. Other suitable materials include, but are not limited to, glass, quartz and transparent polymers. In other embodiments the light guide material is lead glass. Lead glass is a variety of glass in which lead replaces the calcium content of a typical potash glass and in this way the refractive index can be increased. Ordinary glass has a refractive index of n=1.5, while the addition of lead produces a refractive index ranging up to 1.7.

The light guides as set forth below according to embodiments of the invention may comprise a suitable luminescent material for converting the light to another spectral distribution. Suitable luminescent materials include inorganic phosphors, such as doped YAG, LuAG, organic phosphors, organic fluorescent dyes and quantum dots which are highly suitable for the purposes of embodiments of the present invention as set forth below.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in embodiments of the present invention as set forth below. However, it may be preferred for reasons of environmental safety and concern to use cadmium-free quantum dots or at least quantum dots having very low cadmium content.

Organic fluorescent dyes can be used as well. The molecular structure can be designed such that the spectral peak position can be tuned. Examples of suitable organic fluorescent dyes materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

The luminescent material may also be an inorganic phosphor. Examples of inorganic phosphor materials include, but are not limited to, cerium (Ce) doped YAG ($Y_3Al_5O_{12}$) or LuAG ($Lu_3A_{15}O_{12}$). Ce doped YAG emits yellowish light, whereas Ce doped LuAG emits yellow-greenish light. Examples of other inorganic phosphors materials which emit red light may include, but are not limited to ECAS and BSSN; ECAS being $Ca_{1-x}AlSiN_3$:Eux wherein $0<x\leq1$, in other embodiments $0<x\leq0.2$; and BSSN being $Ba_{2-x-z}M_x Si_{5-y}AlyN_{8-y}O_y$:$Eu_z$ wherein M represents Sr or Ca, $0\leq x\leq 1$, $0<y\leq4$, and $0.0005\leq z\leq0.05$, and in embodiments $0\leq x\leq 0.2$.

In embodiments of the invention as set forth below, the luminescent material is made of material selected from the group comprising $(M<I>_{(1-x-y)}M<II>_xM<III>_y)_3$ $(M<IV>_{(1-z)}M<V>_z)_5O_{12}$ where M<I> is selected from the group comprising Y, Lu or mixtures thereof, M<II> is selected from the group comprising Gd, Tb, La, Yb or mixtures thereof, M<III> is selected from the group comprising Tb (when M<II> is not Tb), Pr, Ce, Er, Nd, Eu or mixtures thereof, M<IV> is Al, M<V> is selected from the group comprising Ga, Sc or mixtures thereof, such as Ce doped Yttrium aluminum garnet (YAG, $\underline{Y_3Al_5O_{12}}$) and Ce doped Lutetium-Aluminum-Garnet (LuAG); and $0\leq x\leq 1$, $0<y\leq0.1$, $0<z<1$, $(M<T>_{(1-x-y)}M<II>_xM<III>_y)_2O_3$ where M<I> is selected from the group comprising Y, Lu or mixtures thereof, M<II> is selected from the group comprising Gd, La, Yb or mixtures thereof, M<III> is selected from the group comprising Tb, Pr, Ce, Er, Nd, Eu, Bi, Sb or mixtures thereof, and $0<x\leq1$, $0<y\leq0.1$, $(M<I>_{(1-x-y)}M<II>_xM<III>_y)S_{(1-z)}$Se where M<I> is selected from the group comprising Ca, Sr, Mg, Ba or mixtures thereof, M<II> is selected from the group comprising Ce, Eu, Mn, Tb, Sm, Pr, Sb, Sn or mixtures thereof, M<III> is selected from the group comprising K, Na, Li, Rb, Zn or mixtures thereof, and $0<x\leq0.01$, $0<y\leq0.05$, $0\leq z<1$, $(M<I>_{(1-x-y)}M<II>_xM<III>_y)O$ where M<I> is selected from the group comprising Ca, Sr, Mg, Ba or mixtures thereof, M<II> is selected from the group comprising Ce, Eu, Mn, Tb, Sm, Pr or mixtures thereof, M<III> is selected from the group comprising K, Na, Li, Rb, Zn or mixtures thereof, and $0<x\leq0.1$, $0<y\leq0.1$, $(M<I>_{(2-x)}M<II>_xM<III>_2)O_7$ where M<I> is selected from the group comprising La, Y, Gd, Lu, Ba, Sr or mixtures thereof, M<II> is selected from the group comprising Eu, Tb, Pr, Ce, Nd, Sm, Tm or mixtures thereof, M<III> is selected from the group comprising Hf, Zr, Ti, Ta, Nb or mixtures thereof, and $0<x\leq1$, $(M<I>_{(1-x)}M<II>_xM<III>_{(1-y)}M<IV>_y)O_3$ where M<I> is selected from the group comprising Ba, Sr, Ca, La, Y, Gd, Lu or mixtures thereof, M<II> is selected from the group comprising Eu, Tb, Pr, Ce, Nd, Sm, Tm or mixtures thereof, M<III> is selected from the group comprising Hf; Zr, Ti, Ta, Nb or mixtures thereof, and M<IV> is selected from the group comprising Al, Ga, Sc, Si or mixtures thereof, and $0<x\leq0.1$, $0<y\leq0.1$, or mixtures thereof.

A luminescent light guide may comprise a central emission wavelength within a blue color-range or within a green color-range or within a red color-range. The blue color-range is defined between 380 nanometer and 495 nanometer, the green color-range is defined between 495 nanometer and 590 nanometer, and the red color-range is defined between 590 nanometer and 800 nanometer.

A selection of phosphors which may be used in embodiments, alternative to or in addition to the phosphors described above, is given in table 1 below along with the maximum emission wavelength.

TABLE 1

| Phosphor | Maximum emission wavelength [nm] |
| --- | --- |
| $CaGa_2S_4$: Ce | 475 |
| $SrGa_2S_4$: Ce | 450 |
| $BaAl_2S_4$: Eu | 470 |
| $CaF_2$: Eu | 435 |
| $Bi_4Si_3O_{12}$: Ce | 470 |
| $Ca_3Sc_2Si_3O_{12}$: Ce | 490 |

The light guides as set forth below according to embodiments of the invention may comprise regions with a different density of suitable luminescent material for converting the light to another spectral distribution. In an embodiment a transparent light guide comprises two parts adjacent to each other and only one of which comprises a luminescent material and the other part is transparent or has a relatively low concentration of luminescent material. In another embodiment the light guide comprises yet another, third part, adjacent to the second part, which comprises a different luminescent material or a different concentration of the same luminescent material. The different parts may be integrally formed thus forming one piece or one light guide. In an embodiment a partially reflecting element may be arranged between the different parts of the light guide, for example between the first part and the second part. The partially reflecting element is adapted for transmitting light with one specific wavelength or spectral distribution and for reflecting light with another, different, specific wavelength or spectral distribution. The partially reflecting element may thus be a dichroic element such as a dichroic mirror.

In another embodiment (not shown) a plurality of wavelength converting regions of luminescent material is arranged at the light input surface of a transparent light guide above or on top of a plurality of light sources, such as LEDs. Thus the surface area of each of the plurality of wavelength converting regions correspond to the surface area of each of the plurality of light sources such that light from the light sources is coupled into the transparent light guide via the regions of luminescent material. The converted light is then coupled into the transparent part of the light guide and subsequently guided to the light exit surface of the light guide. The wavelength converting regions may be arranged on the light input surface or they may be formed in the light guide. The wavelength converting regions may form part of a homogeneous layer arranged on or in the light guide at the light input surface. Parts of the homogeneous layer extending between two neighboring wavelength converting regions may be transparent and may additionally or alternatively have the same refractive index as the wavelength converting regions. The different wavelength converting regions may comprise mutually different luminescent materials. The distance between the light sources and the luminescent regions may be below 2 mm, below 1 mm or below 0.5 mm.

In embodiments of the light emitting device according to the invention as set forth below a coupling structure or a coupling medium may be provided for efficiently coupling the light emitted by the light source into the light guide. The coupling structure may be a refractive structure having features, such as e.g. protrusions and recesses forming a wave shaped structure. The typical size of the features of the coupling structure is 5 µm to 500 µm. The shape of the features may be e.g. hemispherical (lenses), prismatic, sinusoidal or random (e.g. sand-blasted). By choosing the appropriate shape, the amount of light coupled into the light guide can be tuned. The refractive structures may be made by mechanical means such as by chiseling, sand blasting or the like. Alternatively, the refractive structures may be made by replication in an appropriate material, such as e.g. polymer or sol-gel material. Alternatively, the coupling structure may be a diffractive structure, where the typical size of the features of the diffractive coupling structure is 0.2 µm to 2 µm. The diffraction angles $\theta_{in}$ inside the light guide are given by the grating equation $\lambda/\Lambda = n_{in} \cdot \sin \theta_{in} - n_{out} \cdot \sin \theta_{out}$, where $\lambda$ is the wavelength of LED light, $\Lambda$ is the grating period, $n_{in}$ and $n_{out}$ are the refractive indices inside and outside the light guide, $\theta_{in}$ and $\theta_{out}$ are the diffraction angle inside and the incident angle outside the light guide, respectively. If we assume the same refractive index $n_{out}=1$ for low-index layer and coupling medium, we find, with the condition for total internal reflection $n_{in} \sin \theta_{in} = n_{out}$, the following condition: $\lambda/\Lambda = 1 - \sin \theta_{out}$, i.e. $\Lambda = \lambda$ for normal incidence $\theta_{out}=0$. Generally, not all other angles $\theta_{out}$ are diffracted into the light guide. This will happen only if its refractive index $n_{in}$ is high enough. From the grating equation it follows that for the condition $n_{in} \geq 2$ all angles are diffracted if $\Lambda = \lambda$. Also other periods and refractive indices may be used, leading to less light that is diffracted into the light guide. Furthermore, in general a lot of light is transmitted ($0^{th}$ order). The amount of diffracted light depends on the shape and height of the grating structures. By choosing the appropriate parameters, the amount of light coupled into the light guide can be tuned. Such diffractive structures most easily are made by replication from structures that have been made by e.g. e-beam lithography or holography. The replication may be done by a method like soft nano-imprint lithography. The coupling medium may e.g. be air or another suitable material.

Turning now to FIG. 1, a 3-dimensional perspective view of a light emitting device 1000 is shown comprising a light guide 4000 adapted for converting incoming light with a first spectral distribution to light with a second, different spectral distribution. The light guide 4000 shown in FIG. 1 comprises or is constructed as a wavelength converter structure 6000 having a first conversion part 6110 in the form of a UV to blue wavelength converter and a second conversion part 6120 in the form of a phosphor adapted to emit white light 1400 based on the blue light input from the first conversion part 6110. Hence, the light emitting device 1000 shown in FIG. 1 comprises a light source in the form of a plurality of LEDs 2100, 2200, 2300 emitting light in the UV to blue wavelength range. The LEDs 2100, 2200, 2300 are arranged on a base or substrate 1500. Particularly, the first conversion part 6110 comprises a polycrystalline cubic Yttrium Aluminum Garnet (YAG), doped with rare earth ions, in an embodiment Europium and/or Terbium, while the second conversion part 6120 comprises a yellow phosphor. This embodiment is advantageous in that the surface area of the light exit surface is smaller than the surface area required to build a light source consisting of direct light emitting LEDs. Thereby, a gain in etendue can be realized.

Alternatives for generating white light with a blue or UV light source include but are not limited to LEDs emitting blue light, which light is converted to green/blue light in the first conversion part 6110, which in turn is converted to white light by the second conversion part being provided as a red phosphor, and LEDs emitting blue light, which light is converted to green light in the first conversion part 6110, which in turn is mixed with red and blue light to generate a white LED source, wherein the mixing is achieved by means of a second conversion part in the form of a red phosphor in front of which a diffusor is arranged.

Figure 2:
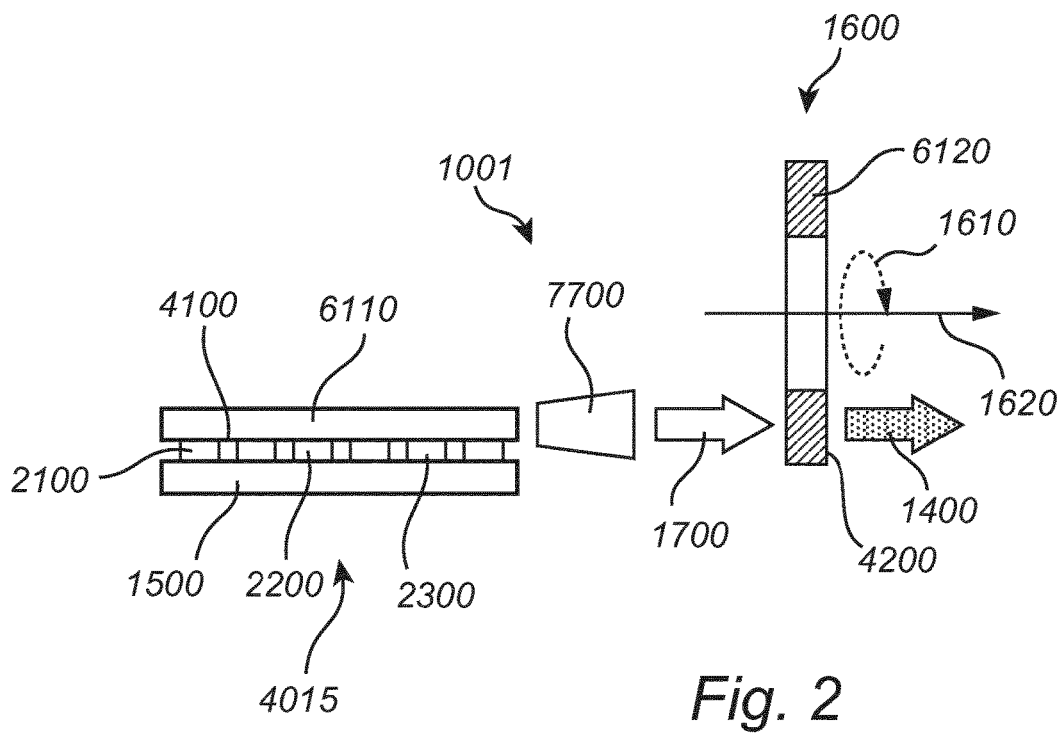
FIG. 2 shows a cross sectional view of a light emitting device comprising a phosphor wheel.

FIG. 2 shows a light emitting device 1001 comprising a light guide 4015 according to embodiments of the invention as set forth below. The light emitting device 1001 shown in FIG. 2 comprises a rotatable phosphor wheel 1600, and it further comprises a coupling element 7700 arranged between the light guide 4015 and the phosphor wheel 1600.

The light emitting device 1001 further comprises a light source in the form of a plurality of LEDs 2100, 2200, 2300 arranged on a base or substrate 1500. The plurality of LEDs 2100, 2200, 2300 are used to pump a conversion part 6110 of the light guide 4015 to produce light 1700 having a third spectral distribution, such as green or blue light. The phosphor wheel 1600, which is rotating in a rotation direction 1610 about an axis of rotation 1620, is used for converting the light 1700 having the third spectral distribution to light 1400 having a second spectral distribution, such as red and/or green light. It is noted that in principle any combination of colors of the light 1700 and the light 1400 is feasible.

As shown in FIG. 2, illustrating the phosphor wheel 1600 in a cross sectional side view, the phosphor wheel 1600 is used in the transparent mode, i.e. incident light 1700 enters the phosphor wheel 1600 at one side, is transmitted through the phosphor wheel 1600 and emitted from an opposite side thereof forming the light exit surface 4200. Alternatively, the phosphor wheel 1600 may be used in the reflective mode (not shown) such that light is emitted from the same surface as the surface through which it enters the phosphor wheel.

The phosphor wheel 1600 may comprise only one phosphor throughout. Alternatively, the phosphor wheel 1600 may also comprise segments without any phosphor such that also part of the light 1700 may be transmitted without being converted. In this way sequentially other colors can be generated. In another alternative, the phosphor wheel 1600 may also comprise multiple phosphor segments, e.g. segments of phosphors emitting yellow, green and red light, respectively, such as to create a multi-colored light output. In yet another alternative, the light emitting device 1001 may be adapted for generating white light by employing a pixelated phosphor-reflector pattern on the phosphor wheel 1600.

In an embodiment the coupling element 7700 is an optical element suitable for collimating the light 1700 incident on the phosphor wheel 1600, but it may also be a coupling medium or a coupling structure such as e.g. the coupling medium or the coupling structure 7700 described above. The light emitting device 1001 may furthermore comprise additional lenses and/or collimators. For example, additional optics may be positioned such as to collimate the light emitted by the light sources 2100, 2200, 2300 and/or the light 1400 emitted by the light emitting device 1001.

Figure 3:
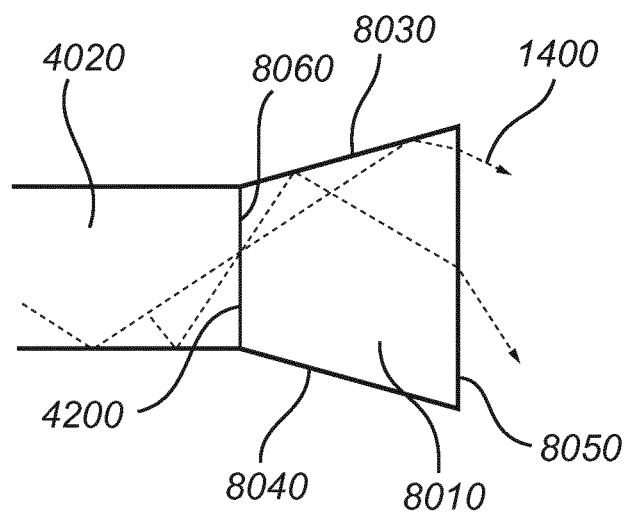
FIG. 3 shows side view of a light guide which is provided with an optical element at an exit surface.

FIG. 3 shows a light guide 4020 which comprises an optical element 8010 arranged with a light input facet 8060 in optical connection with a light exit surface 4200 of the light guide 4020. The optical element 8010 is made of a material having a high refractive index, in an embodiment a refractive index which is equal to or higher than that of the light guide 4020, and comprises a quadrangular cross section and two tapered sides 8030 and 8040. The tapered sides 8030 and 8040 are inclined outwardly from the light exit surface 4200 of the light guide 4020 such that the light exit facet 8050 of the optical element 8010 has a larger surface area than both the light input facet 8060 and the light exit surface 4200 of the light guide 4020. The optical element 8010 may alternatively have more than two, particularly four, tapered sides. In an alternative, the optical element 8010 has a circular cross section and one circumferential tapered side. With such an arrangement light will be reflected at the inclined sides 8030 and 8040 and has a large chance to escape if it hits the light exit facet 8050, as the light exit facet 8050 is large compared to the light input facet 8060. The shape of the sides 8030 and 8040 may also be curved and chosen such that all light escapes through the light exit facet 8050.

The optical element may also be integrally formed from the light guide 4020, for example by shaping a part of the light guide such that a predetermined optical element is formed at one of the ends of the light guide. The optical element may for example have the shape of a collimator, or may have a cross-sectional shape of a trapezoid and in an embodiment outside surfaces of the trapezoid shape are provided with reflective layers. Thereby the received light may be shaped such as to comprise a larger spot size while simultaneously minimizing the loss of light through other surfaces than the light exit surface, thus also improving the intensity of the emitted light. In another embodiment the optical element has the shape of a lens array, for example convex or concave lenses or combinations thereof. Thereby the received light may be shaped such as to form focused light, defocused light or a combination thereof. In case of an array of lenses it is furthermore feasible that the emitted light may comprise two or more separate beams each formed by one or more lenses of the array. In more general terms, the light guide may thus have differently shaped parts with different sizes. Thereby a light guide is provided with which light may be shaped in that any one or more of the direction of emission of light from the light exit surface, the beam size and beam shape of the light emitted from the light exit surface may be tuned in a particularly simple manner, e.g. by altering the size and/or shape of the light exit surface. Thus, a part of the light guide functions as an optical element.

The optical element may also be a light concentrating element (not shown) arranged at the light exit surface of the light guide. The light concentrating element comprises a quadrangular cross section and two outwardly curved sides such that the light exit surface of the light concentrating element has a larger surface area than the light exit surface of the light guide. The light concentrating element may alternatively have more than two, particularly four, tapered sides. The light concentrating element may be a compound parabolic light concentrating element (CPC) having parabolic curved sides. In an alternative, the light concentrating element has a circular cross section and one circumferential tapered side. If, in an alternative, the refractive index of the light concentrating element is chosen to be lower than that of the light guide (but higher than that of air), still an appreciable amount of light can be extracted. This allows for a light concentrating element which is easy and cheap to manufacture compared to one made of a material with a high refractive index. For example, if the light guide has a refractive index of n=1.8 and the light concentrating element has a refractive index of n=1.5 (glass), a gain of a factor of 2 in light output may be achieved. For a light concentrating element with a refractive index of n=1.8, the gain would be about 10% more. Actually, not all light will be extracted since there will be Fresnel reflections at the interface between the optical element or the light concentrating element and the external medium, generally being air. These Fresnel reflections may be reduced by using an appropriate anti-reflection coating, i.e. a quarter-lambda dielectric stack or moth-eye structure. In case the light output as function of position over the light exit facet is inhomogeneous, the coverage with anti-reflection coating might be varied, e.g. by varying the thickness of the coating.

One of the interesting features of a CPC is that the etendue (=$n^2$×area×solid angle, where n is the refractive index) of the light is conserved. The shape and size of the light input facet of the CPC can be adapted to those of the light exit surface of the light guide and/or vice versa. A large advantage of a CPC is that the incoming light distribution is transformed into a light distribution that fits optimally to the acceptable etendue of a given application. The shape of the light exit facet of the CPC may be e.g. rectangular or circular, depending on the desires. For example, for a digital projector there will be requirements to the size (height and width) of the beam, as well as for the divergence. The corresponding etendue will be conserved in a CPC. In this case it will be beneficial to use a CPC with rectangular light input and exit facets having the desired height/width ratio of the display panel used. For a spot light application, the requirements are less severe. The light exit facet of the CPC may be circular, but may also have another shape (e.g. rectangular) to illuminate a particularly shaped area or a desired pattern to project such pattern on screens, walls, buildings, infrastructures etc. Although CPCs offer a lot of flexibility in design, their length can be rather large. In general, it is possible to design shorter optical elements with the same performance. To this end, the surface shape and/or the exit surface may be adapted, e.g. to have a more curved exit surface such as to concentrate the light. One additional advantage is that the CPC can be used to overcome possible aspect ratio mismatches when the size of the light guide is restrained by the dimensions of the LED and the size of the light exit facet is determined by the subsequent optical components. Furthermore, it is possible to place a mirror (not shown) partially covering the light exit facet of the CPC, e.g. using a mirror which has a 'hole' near or in its center. In this way the exit plane of the CPC is narrowed down, part of the light is being reflected back into the CPC and the light guide, and thus the exit etendue of the light would be reduced. This would, naturally, decrease the amount of light that is extracted from the CPC and light guide. However, if this mirror has a high reflectivity, like e.g. Alanod 4200AG, the light can be effectively injected back into the CPC and light guide, where it may be recycled by TIR. This will not change the angular distribution of the light, but it will alter the position at which the light will hit the CPC exit plane after recycling thus increasing the luminous flux. In this way, part of the light, that normally would be sacrificed in order to reduce the system etendue, can be re-gained and used to increase for example the homogeneity. This is of major importance if the system is used in a digital projection application. By choosing the mirror in the different ways, the same set of CPC and light guide can be used to address systems using different panel sizes and aspect ratio's, without having to sacrifice a large amount of light. In this way, one single system can be used for various digital projection applications.

By using any one of the above structures described with reference to FIG. 3, problems in connection with extracting light from the high-index light guide material to a low-index material like air, particularly related to the efficiency of the extraction, are solved.

Figure 4:
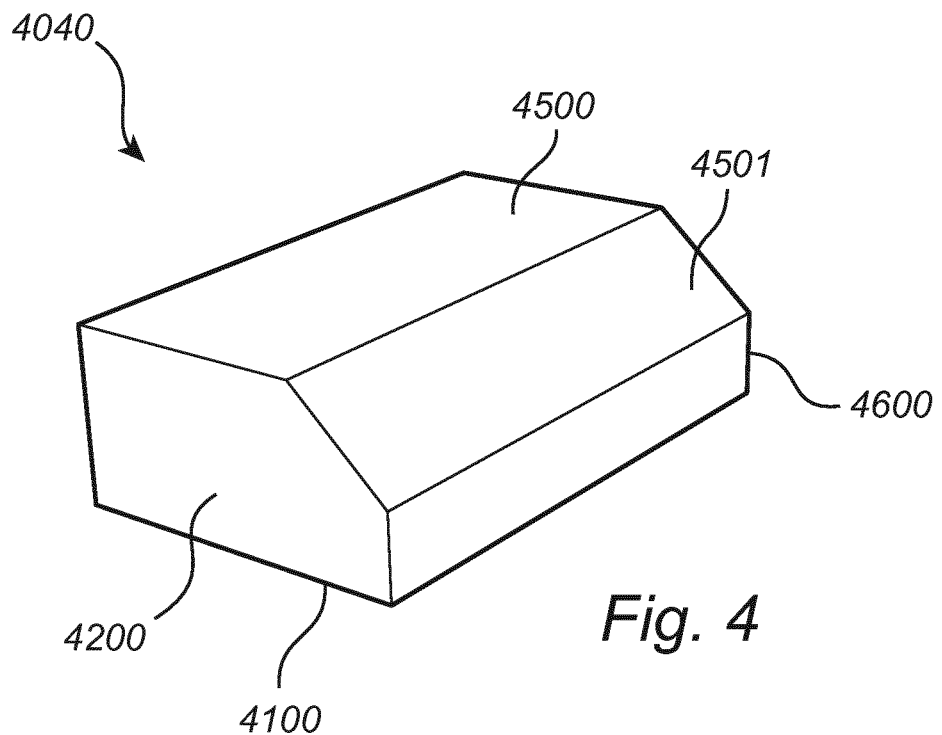
FIG. 4 shows a perspective view of a light guide which is shaped throughout its length such as to provide a shaped light exit surface.
Figure 5:
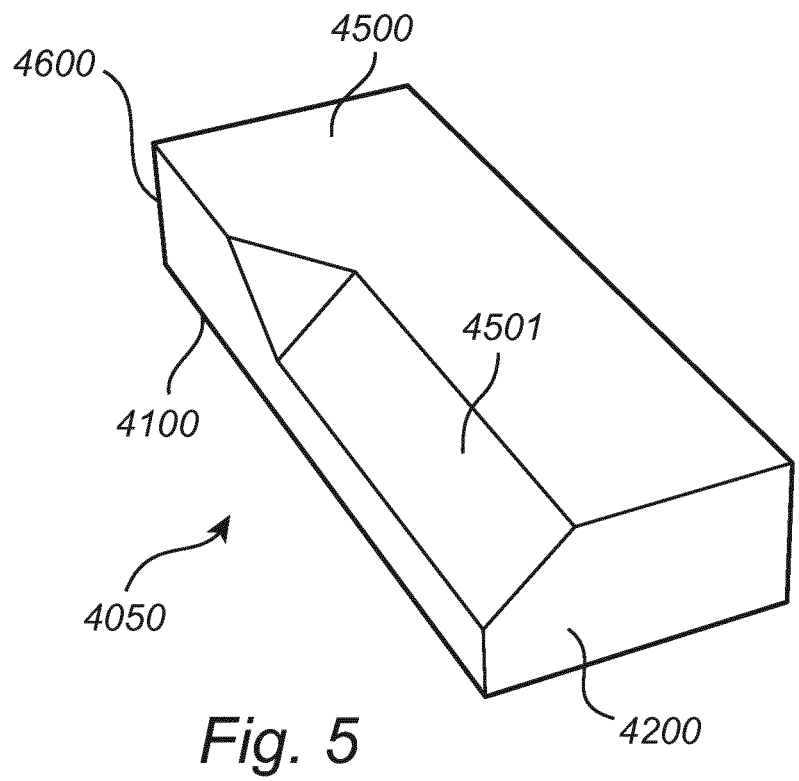
FIG. 5 shows a side view of a light guide which is shaped over a part of its length such as to provide a shaped light exit surface.

With reference to FIGS. 4 and 5 different possibilities for providing a light distribution having a particular shape will be described. FIG. 4 shows a perspective view of a light guide 4040 which is shaped throughout its length in order to provide a shaped light exit surface 4200. The light guide 4040 may be a transparent light guide or a light guide adapted for converting light with a first spectral distribution to light with a second spectral distribution. A part 4501 of the light guide 4040 extending throughout the length of the light guide 4040, particularly adjacent to the surface 4500 and opposite to the light input surface 4100, has been removed such as to provide the light guide 4040 with a shape corresponding to the desired shape of the light distribution at the light exit surface 4200, the shape extending throughout the entire length of the light guide 4040 from the light exit surface 4200 to the opposite surface 4600.

FIG. 5 shows a side view of a light guide 4050 which is shaped over a part of its length such as to provide a shaped light exit surface 4200. The light guide 4050 may be a transparent light guide or a light guide adapted for converting light with a first spectral distribution to light with a second spectral distribution. A part 4501 of the light guide 4050 extending over a part of the length of the light guide 4050 has been removed, particularly adjacent to the surface 4500 and opposite to the light input surface 4100, such as to provide the light guide 4050 with a shape corresponding to the desired shape of the light distribution at the light exit surface 4200, the shape extending over a part of the length of the light guide 4050 adjacent the light exit surface 4200.

Another part or more than one part of the light guide may be removed such as to provide for other shapes of the light exit surface. Any feasible shape of the light exit surface may be obtained in this way. Also, the light guide may be divided partly or fully into several parts having different shapes, such that more complex shapes may be obtained. The part or parts removed from the light guide may be removed by means of e.g. sawing, cutting or the like followed by polishing of the surface that is exposed after the removal of the part or parts. In another alternative a central part of the light guide may be removed, e.g. by drilling, such as to provide a hole in the light exit surface.

In an alternative embodiment, a light distribution having a particular shape may also be obtained by surface treating, e.g. roughening, a part of the light exit surface of the light guide, whilst leaving the remaining part of the light exit surface smooth. In this embodiment no parts of the light guide need to be removed. Likewise any combination of the above possibilities for obtaining a light distribution having a particular shape is feasible.

Figure 6:
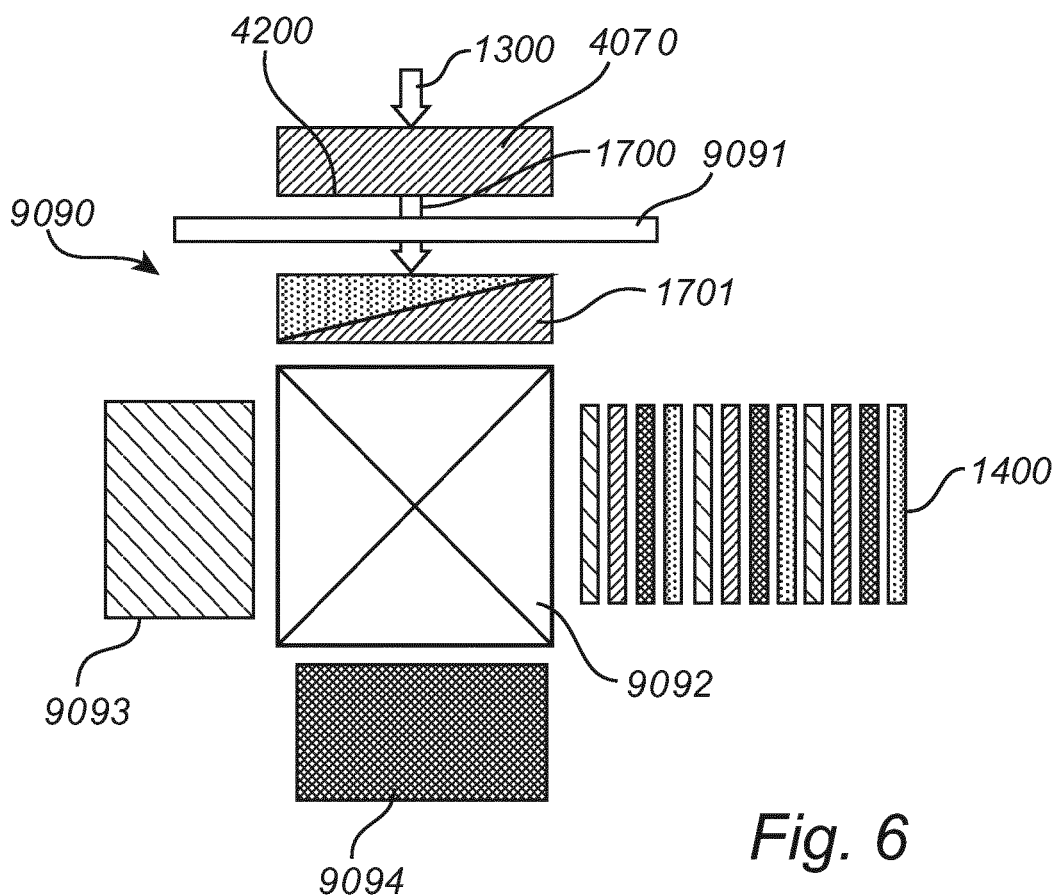
FIG. 6 shows a side view of a lighting system with a light guide and additional light sources and which is provided with a filter and a dichroic optical element.

FIG. 6 shows a side view of a lighting system, e.g. a digital projector, with a light guide 4070 which is adapted for converting incident light 1300 in such a way that the emitted light 1700 is in the yellow and/or orange wavelength range, i.e. roughly in the wavelength range of 560 nm to 600 nm. The light guide 4070 may e.g. be provided as a transparent garnet made of ceramic materials such as Ce-doped $(Lu,Gd)_3Al_5O_{12}$, $(Y,Gd)_3Al_5O_{12}$ or $(Y,Tb)_3Al_5O_{12}$. With higher Ce-content and/or higher substitution levels of e.g. Gd and/or Tb in favor of Ce, the spectral distribution of the light emitted by the light guide can be shifted to higher wavelengths. In an embodiment, the light guide 4070 is fully transparent.

At the light exit surface 4200 an optical element 9090 is provided. The optical element 9090 comprises a filter 9091 for filtering the light 1700 emitted from the light guide 4070 such as to provide filtered light 1701, at least one further light source 9093, 9094 and an optical component 9092 adapted for combining the filtered light 1701 and the light from the at least one further light source 9093, 9094 such as to provide a common light output 1400. The filter 9091 may be an absorption filter or a reflective filter, which may be fixed or switchable. A switchable filter may e.g. be obtained by providing a reflective dichroic mirror, which may be low-pass, band-pass or high-pass according to the desired light output, and a switchable mirror and placing the switchable mirror upstream of the dichroic mirror seen in the light propagation direction. Furthermore, it is also feasible to combine two or more filters and/or mirrors to select a desired light output. The filter 9091 shown in FIG. 6 is a switchable filter enabling the transmission of unfiltered yellow and/or orange light or filtered light, particularly and in the embodiment shown filtered red light, according to the switching state of the filter 9091. The spectral distribution of the filtered light depends on the characteristics of the filter 9091 employed. The optical component 9092 as shown may be a cross dichroic prism also known as an X-cube or it may in an alternative be a suitable set of individual dichroic filters.

In the embodiment shown two further light sources 9093 and 9094 are provided, the further light source 9093 being a blue light source and the further light source 9094 being a green light source. Other colors and/or a higher number of further light sources may be feasible too. One or more of the further light sources may also be light guides according to embodiments of the invention as set forth below. A further option is to use the light filtered out by the filter 9091 as a further light source. The common light output 1400 is thus a combination of light 1701 emitted by the light guide 4070 and filtered by the filter 9091 and light emitted by the respective two further light sources 9093 and 9094. The common light output 1400 may advantageously be white light.

The solution shown in FIG. 6 is advantageous in that it is scalable, cost effective and easily adaptable according to the requirements for a given application of a light emitting device according to embodiments of the invention.

Figure 7:
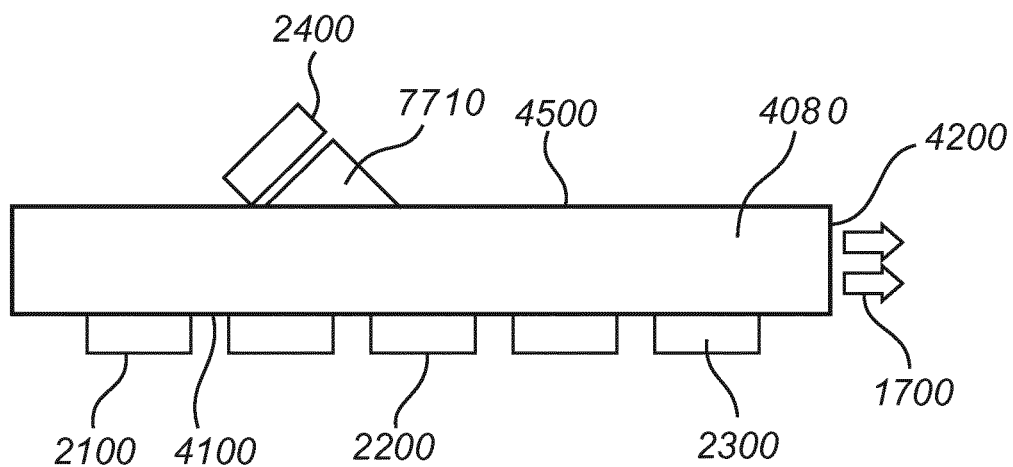
FIG. 7 shows a light guide provided with a second light source arranged at a surface of the light guide different from a first light input surface.

FIG. 7 shows a side view of a light guide 4080 which comprises first light sources 2100, 2200, 2300 emitting light with a first spectral distribution and being arranged adjacent the light input surface 4100 of the light guide 4080. The light guide 4080 furthermore comprises at least one second light source 2400 emitting light with a second spectral distribution, which is different from the first spectral distribution, and which is arranged adjacent to a surface 4500 of the light guide 4080 extending parallel and opposite to the light input surface 4100. The light guide 4080 is adapted for converting at least a part of the light with the first spectral distribution to light with a third spectral distribution different from the first spectral distribution and for guiding the light with the second spectral distribution without converting it. In this way the light 1700 emitted by the light guide 4080 through the light exit surface 4200 comprises a combination of at least the light with the second and third spectral distribution, respectively, and possibly also of the light with the first spectral distribution, as part of this light may remain unconverted. By way of a non-limiting example, the first spectral distribution may be in the wavelength range below 400 nm, the second spectral distribution may be in the red wavelength range, i.e. 500 to 800 nm and the third spectral distribution may be in the wavelength range 400 to 500 nm. By way of another non-limiting example, the first spectral distribution may be in the green wavelength range, i.e. 400 to 500 nm, the second spectral distribution may be in the red wavelength range, i.e. 500 to 800 nm and the third spectral distribution may be in the wavelength range 440 to 600 nm. By way of yet another non-limiting example the first light sources 2100, 2200, 2300 may be emitting in the wavelength range 440 to 480 nm, the light guide 4080 may convert the light emitted by the first light sources to light with a wavelength in the range 480 to 600 nm and the second light source 2400 may be emitting in the wavelength range 600 to 800 nm. It is noted that in principle all feasible combinations of first, second and third spectral distributions may be used. Thereby a simple and efficient way of producing white light is obtained.

As shown in FIG. 7 the light guide 4080 further comprises a coupling element 7710 adapted for coupling light from the second light source 2400 into the light guide 4080. The coupling element 7710 may be a coupling structure or coupling medium as described above. It is noted that the coupling element is an optional element, and may thus also be omitted, in which case the second light source may be arranged in direct optical contact with the light guide.

More than one second light source may be provided. In these embodiments it is furthermore feasible to provide second light sources emitting light with different spectral distributions such that second light sources arranged at different surfaces emit light having different spectral distributions. Furthermore, second light sources may alternatively or additionally be arranged at more than one of the surfaces of the light guide 4080 different from the light input surface 4100, e.g. at two different surfaces. For example the at least one second light source 2400 may be arranged at a surface opposite to the light exit surface 4200 of the light guide 4080.

Figure 8A:
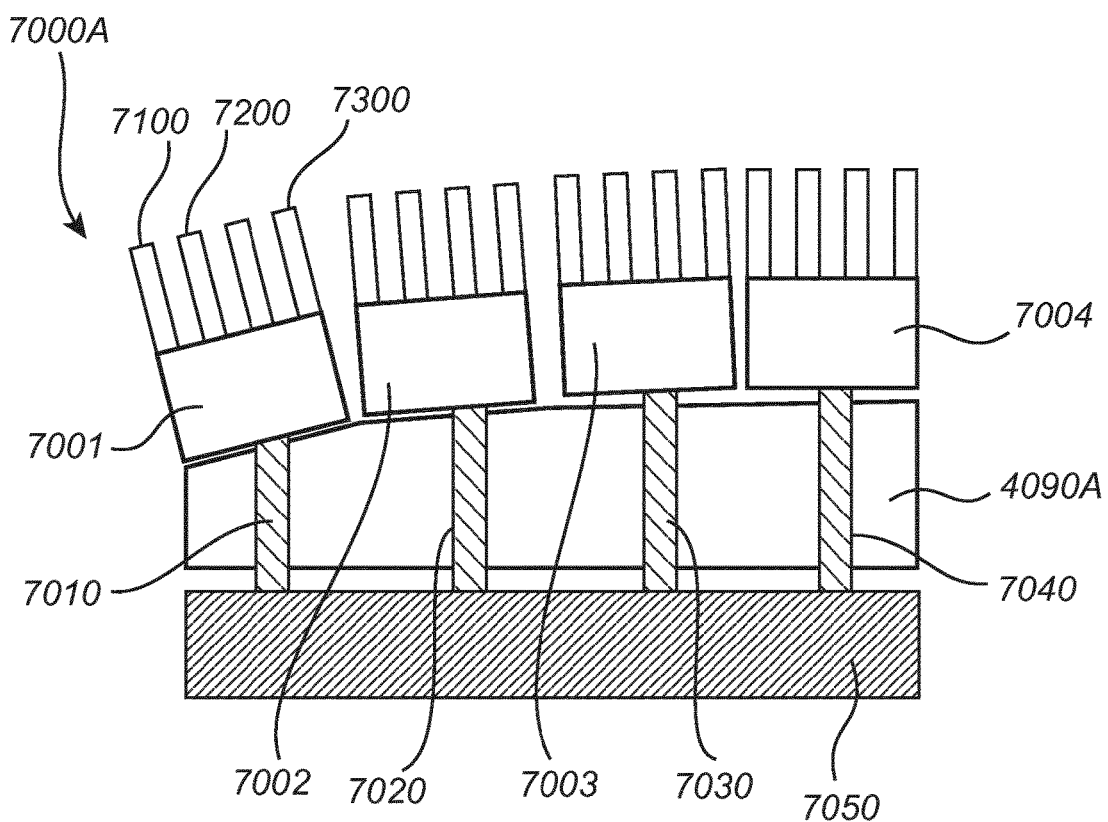
FIGS. 8A and 8B show light guides provided with a heat sink element arranged adjacent a surface of the light guide.
Figure 8B:
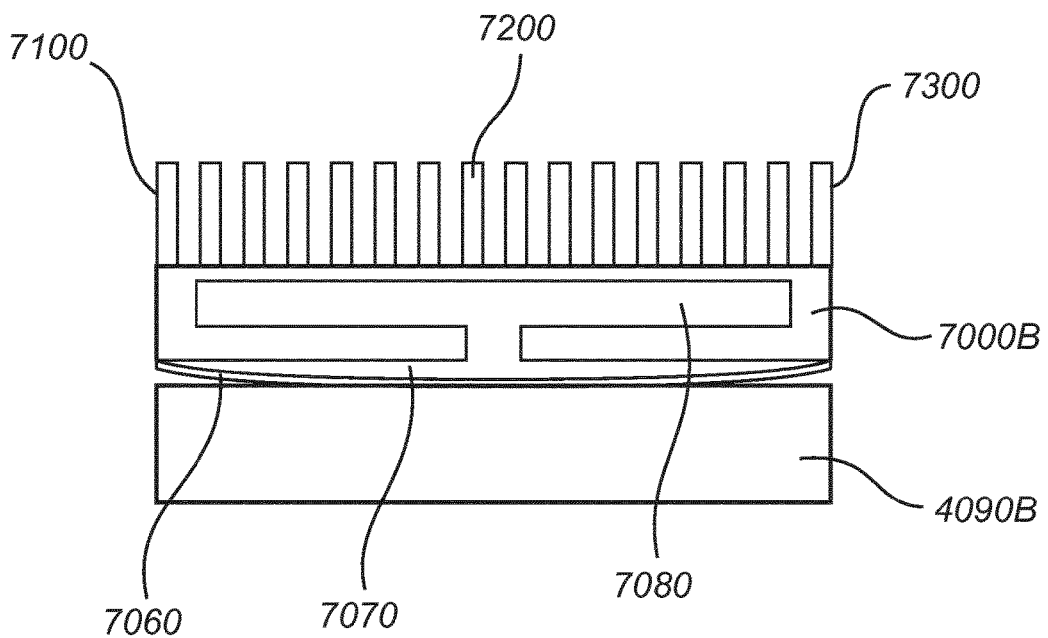

FIGS. 8A and 8B show a side view of a light guide 4090A and a light guide 4090B, respectively, that comprise a heat sink element 7000A, 7000B, respectively, arranged on one of the surfaces of the light guide 4090A, 4090B, respectively, different from the light input surface, in embodiments at a distance of about 30 μm or less therefrom. Irrespective of the embodiment the respective heat sink element 7000A, 7000B comprises fins 7100, 7200, 7300 for improved heat dissipation, the fins, however, being optional elements. Irrespective of the embodiment the respective heat sink element 7000A, 7000B is adapted to be conformable to the surface shape of the light guide, and is thus adapted for providing a conformal thermal contact over the whole contact area with the light guide. Thereby an increased thermal contact area and thus an improved cooling of the light guide is obtained and the existing tolerance limits on the positioning of the heat sink element become less critical.

FIG. 8A shows that heat sink element 7000A comprises a plurality of heat sink parts, here four heat sink parts 7001, 7002, 7003 and 7004, one or more of which, here all four, may be provided with fins. Obviously, the more heat sink parts the heat sink element 7000A comprises, the more precisely the heat sink element 7000 may be conformed to the surface of the light guide. Each heat sink part 7001, 7002, 7003, 7004 is adapted for providing a conformal thermal contact over the whole contact area with the light guide. The heat sink parts may be arranged in mutually different distances from the surface of the light guide.

Furthermore, the heat sink element 7000A comprises a common carrier 7050 to which the heat sink parts 7001, 7002, 7003 and 7004 are attached individually by means of attachment elements 7010, 7020, 7030 and 7040, respectively. Alternatively each heat sink part may be assigned its own carrier. It is noted that these elements are optional.

FIG. 8B shows that heat sink element 7000B comprises a bottom part 7060 adapted to be conformable to the shape of the surface of the light guide 4090B at which it is to be arranged. The bottom part 7060 is flexible and may e.g. be a thermally conductive metal layer such as a copper layer. The heat sink element 7000B further comprises a thermally conductive layer 7070 arranged between the bottom element 7060 and the remainder of the heat sink element 7000B for improved flexibility and conformability of the heat sink element 7000B. The thermally conductive layer 7070 may e.g. be a thermally conductive fluid or paste. The thermally conductive layer 7070 is in an embodiment highly reflective and/or comprises a highly reflective coating. The heat sink element 7000B further comprises a fluid reservoir 7080 arranged inside the heat sink element 7000B for generating a fluid flow for improved heat dissipation. In an alternative, the fluid reservoir 7080 may also be arranged externally on the heat sink element 7000B, e.g. extending along a part of or the whole external periphery of the heat sink element 7000B. The fluid flow may be enhanced by means of a pump. It is noted that the conductive layer 7070 and the fluid reservoir 7080 are optional elements.

Irrespective of the embodiment, the heat sink element 7000A, 7000B may be made of a material selected from copper, aluminum, silver, gold, silicon carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof. Furthermore, a heat sink element combining features of the embodiments described above is feasible. Also, it is feasible to arrange a heat sink element according to any of the above embodiments at more than one surface of the light guide 4090A or 4090B.

Finally it is noted that the provision of a heat sink element as described above is especially advantageous in a light emitting device employing a light source emitting in the red wavelength range and/or being adapted for emitting light in the infrared wavelength range, e.g. by comprising an IR emitting phosphor.

Figure 9:
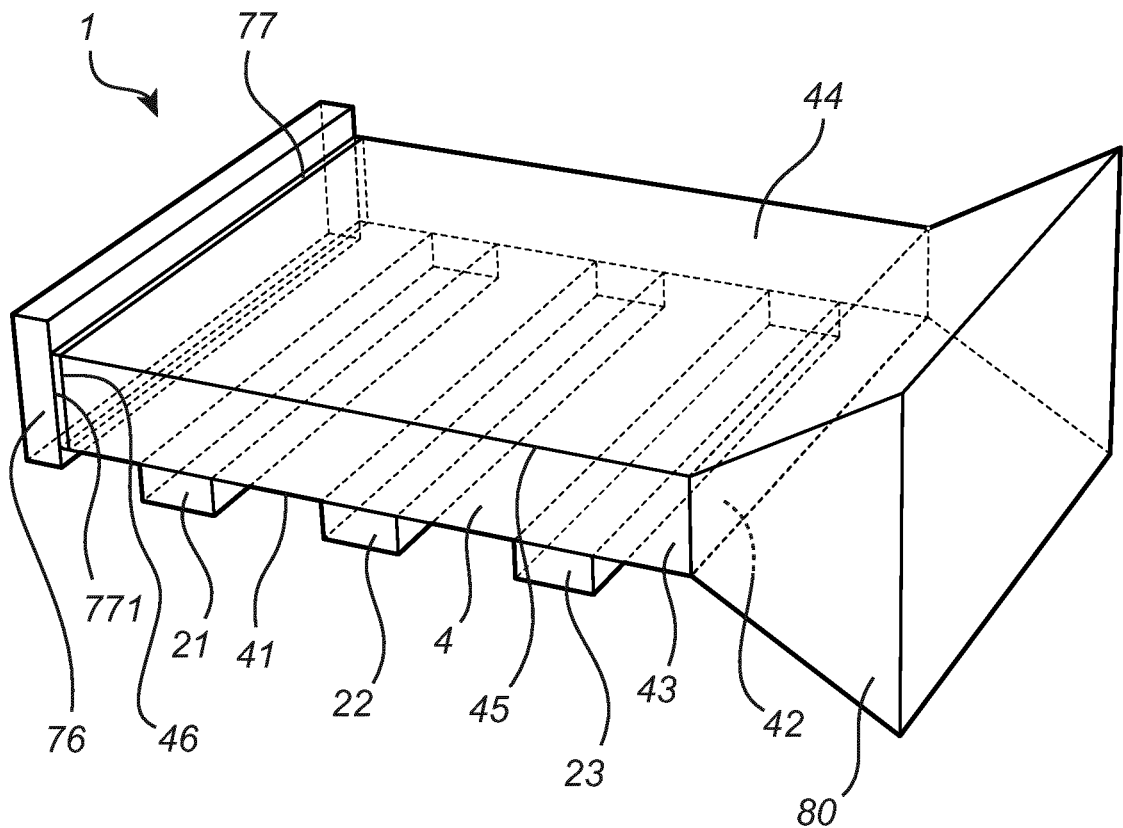
FIG. 9 shows a perspective view of a first embodiment of a light emitting device according to the invention.
Figure 10:
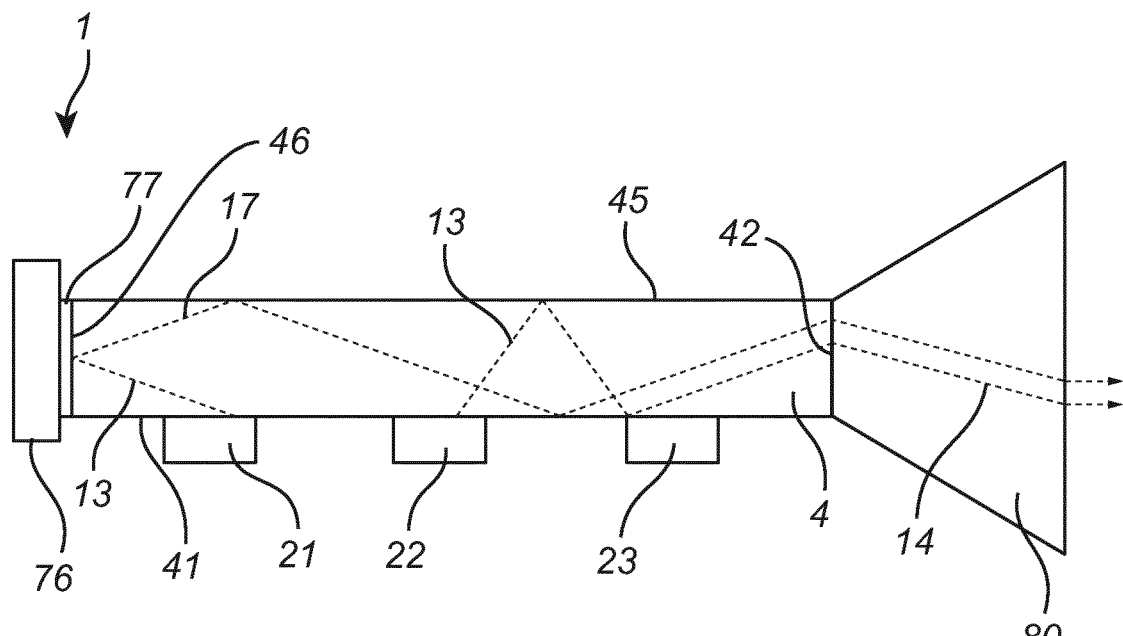
FIG. 10 shows a side view of the light emitting device according to FIG. 9.

FIG. 9 shows a perspective view of a light emitting device 1 according to a first and general embodiment of the invention. FIG. 10 shows a side view of the light emitting device 1 according to FIG. 9. The light emitting device 1 generally comprises a plurality of light sources 21, 22, 23 each comprising at least one solid state light source such as a LED or laser diode and a light guide 4 having a light input surface 41 and a light exit surface 42. Suitable types of LEDs or laser diodes are described above.

The light guide 4 is shown shaped generally as a square plate having a light input surface 41, a light exit surface 42 extending at an angle different from zero with respect to the light input surface 41 such that the light exit surface 42 is an end surface of the light guide 4. The light guide 4 further comprises a first further surface 46 extending parallel to and opposite the light exit surface 42 and a second, third and fourth further surface 43, 44 and 45, respectively. The light guide 4 may also be shaped e.g. as a bar or a rod.

It is noted that embodiments in which the angle between the light input surface 41 and the light exit surface 42 are less than 90°, equal to 90° and larger than 90° are all feasible and within the scope of the invention.

The light guide 4 is made of a luminescent material, suitable luminescent materials being described above. Furthermore, the light guide 4 is in an embodiment transparent, luminescent, light concentrating or a combination thereof, suitable materials being described above.

The light emitting device 1 further comprises a phosphor element 77 arranged adjacent to, and according to embodiments in optical contact with, the first further surface 46 of the light guide 4. The phosphor element 77 is adapted for converting incident light to third light 17 with a third spectral distribution. The first further surface 46 of the light guide 4 is in this embodiment opposite to the light exit surface 42 of the light guide 4.

The light emitting device 1 further comprises a reflective element 76 arranged adjacent to or on a surface 771 of the phosphor element 77 opposite to, or in other words facing away from, the first further surface 46 of the light guide 4. The phosphor element 77 is thus arranged in between the first further surface 46 of the light guide 4 and the reflective element 76. In an embodiment the phosphor element 77 and the reflective element 76 are arranged in optical contact with one another.

As shown in this embodiment the reflective element 76 is arranged in direct contact with the phosphor element 77 and the phosphor element 77 is arranged in direct contact with the first further surface 46. Alternatively, a gap may be provided between one or both of the reflective element 76 and the phosphor element 77 and the phosphor element 77 and the first further surface 46, respectively. Such a gap may be filled with e.g. air or an optical adhesive.

The reflective element 76 may e.g. be a mirror plate, a mirror foil or a mirror coating which may be glued, e.g. by means of an optical adhesive, coated or deposited onto the phosphor element 77. Suitable deposition methods include, but are not limited to, thin film deposition methods, chemical deposition methods and physical deposition methods.

The reflective element 76, which is in FIG. 9 shown as a mirror plate, covers substantially the complete surface area of the phosphor element 77.

The light emitting device furthermore comprises in this embodiment an optical element 80 arranged at the light exit surface 42 of the light guide 4 and in this embodiment in optical contact with the light exit surface 42. In an embodiment, the optical element 80 is a lens such as a concave lens, a convex lens or a lens array.

With reference to FIG. 10, the light emitting device 1 generally works as follows. First light 13 having a first spectral distribution is emitted by the light sources 21, 22, 23. The first light 13 having the first spectral distribution is then coupled into the light guide 4 at the light input surface 41. At least a part of the first light 13 with the first spectral distribution is converted by the light guide 4 to second light 14 having a second spectral distribution. At least a part of the first light 13 with the first spectral distribution and/or a part of the second light 14 having a second spectral distribution is propagating through the phosphor element 77, reflected off the reflective element 76 and propagating back through the phosphor element 77. At least a part of the light propagating through the phosphor element 77 is converted to third light 17 having a third spectral distribution. The third light 17 having a third spectral distribution may travel through the light guide substantially without being converted. Finally, the second light 14 having a second spectral distribution, the third light 17 having a third spectral distribution and any remaining unconverted first light 13 with the first spectral distribution is coupled out of the light guide 4 at the light exit surface 42, and is thus emitted by the light emitting device 1.

By extracting the second light 14 having the second spectral distribution, the third light 17 having the third spectral distribution and any remaining unconverted first light 13 with the first spectral distribution from the light guide 4 through one surface 42 thereof only, an intensity gain is achieved thus leading to a concentration of the light while simultaneously ensuring a light output with a broad spectral distribution. The optical element 80 serves in this embodiment to shape the light, in case of a lens particularly by focusing it, thereby leading to a shaping, e.g. a further concentration, of the light, e.g. according to a desired application.

In this way an RGB light source or a white light source with light having a high power and a high concentration as well as a low etendue is provided.

The first spectral distribution, the second spectral distribution and third spectral distribution are in embodiments mutually different spectral distributions. Thus, in an embodiment, the light sources 21, 22, 23 emit blue light, the light guide is adapted for converting blue light to green light and the phosphor element 77 is adapted for converting blue and/or green light to red light.

In an embodiment (not shown) the optical element comprises a selectively reflecting optical element which selectively reflects a predetermined spectral distribution or wavelength range. The optical element for example comprises a dichroic filter or a dichroic filter at a light exit surface of the optical element 80 which may be a compound parabolic concentrator. In this way a more efficient wavelength conversion by the phosphor element 77 is achieved by selectively reflecting light with a predetermined spectral distribution (which is not converted by the phosphor element to third light with the third spectral distribution) such that more light is converted by the phosphor element 77 to third light, because the light reflected by the dichroic filter will at least partly be transported to and received at the phosphor element 77 and thus more light is converted to third light. For example, the selectively reflective optical element reflects first light and second light which is then guided via the light guide to the phosphor element 77 where it is (at least partly) converted to third light, thereby increasing the amount of third light that will be exiting from the light guide. For example, in case of a red phosphor element, green and/or yellow light is reflected by the selectively reflective optical element and is guided via the light guide to the red phosphor element where it is (at least partly) converted to red light thereby providing a more efficient conversion to red light.

In alternative embodiments any one or more of the surfaces of the first light guide 4 other than the light input surface 41, the light exit surface 42 and the first further surface 46, i.e. the second, third and fourth further surfaces 43, 44 and 45, may be provided with a mirror element or a reflective layer.

Figure 11:
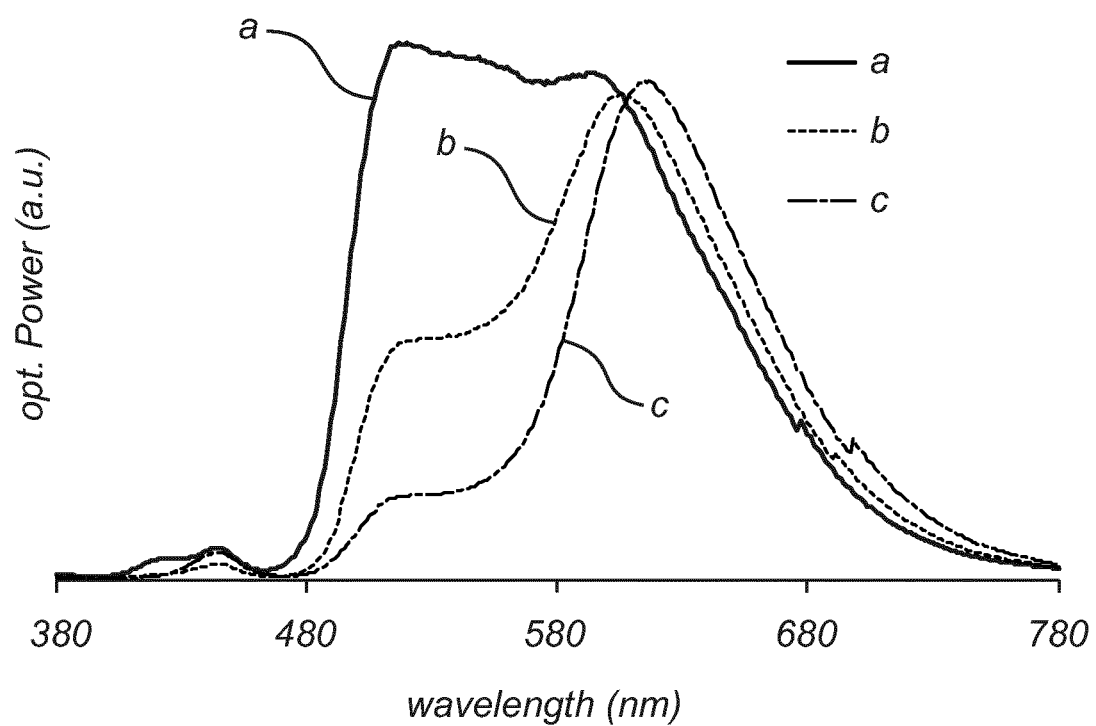
FIG. 11 shows a graph illustrating the spectral distribution of the light output of a) a light emitting device according to FIGS. 9 and 10, b) a light emitting device with the phosphor element arranged at the light exit surface and c) a light emitting device according to the invention comprising two phosphor elements.

FIG. 11 shows a graph illustrating the spectral distribution of the light output of three different light emitting devices. Curve a) illustrates the spectral distribution of the light output of a light emitting device according to the invention and as shown in FIGS. 9 and 10, curve b) that of a light emitting device of the type described in the introductory description and curve c) that of a light emitting device according to the invention and comprising two phosphor elements (cf. e.g. FIGS. 14 and 15). The curves show the optical power of the light output of the light emitting device in question as a function of the wavelength.

It is apparent from FIG. 11 that a light emitting device according to the invention, cf. curve a), provides for a light output with a spectral distribution having a high optical power, i.e. high intensity, over a considerably broader wavelength range as compared with the prior art device, cf. curve b).

Also, it may be seen that for a light emitting device according to the invention comprising two phosphor elements, cf. curve c), the peak optical power is increased and shifted towards longer wavelengths as compared to the prior art.

Figure 12:
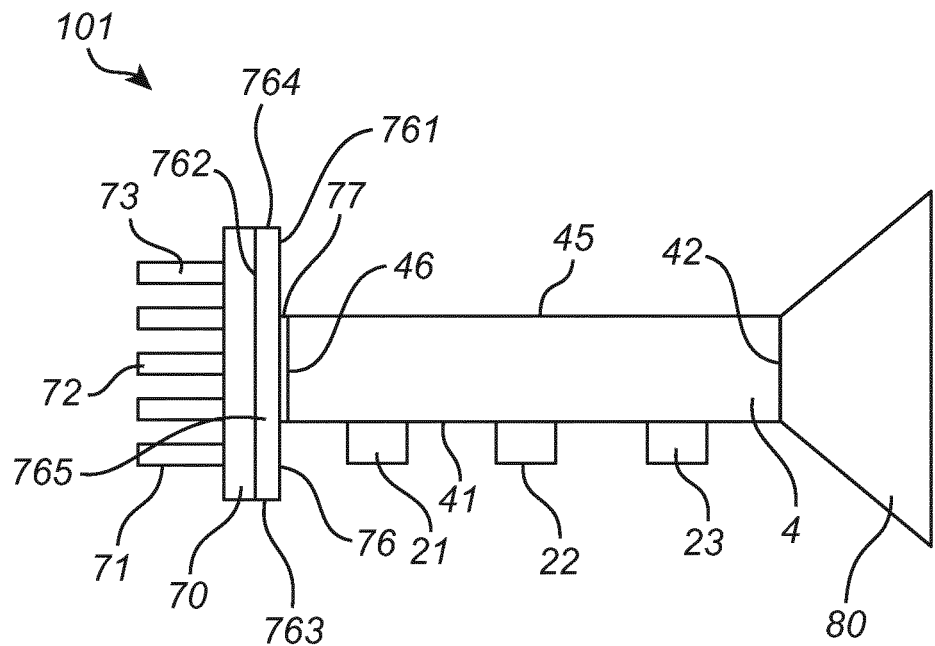
FIG. 12 shows a side view of a second embodiment of a light emitting device according to the invention.

Turning now to FIG. 12, a side view of a second embodiment of a light emitting device 101 according to the invention is shown. The light emitting device 101 differs from that described above with reference to FIGS. 9 and 10 in that it further comprises a first heat sink element 70. The first heat sink element 70 is generally arranged on or at a surface 762 of the reflective element 76 facing away from the phosphor element 77 and thereby also facing away from the first further surface 46 of the light guide 4. In this embodiment the first heat sink element 70 is arranged adjacent to the reflective element 76 opposite to the phosphor element 77.

The first heat sink element 70 is in this embodiment non-transparent and comprises one or more fins 71, 72, 73 for improved heat distribution. It is noted, however, that the fins 71, 72, 73 may in principle be omitted.

The first heat sink element 70 is in an embodiment made of a metal such as copper, iron or aluminum. The first heat sink element 70 may also be made of a reflective ceramic such as alumina or boron nitride. In more general terms, suitable materials for such a non-transparent first heat sink element 70 are materials which have a high heat conductivity, i.e. a heat conductivity which is larger than e.g. 1 W/(m*K), and in an embodiment larger than 10 W/(m*K) or even larger than 20 W/(K*m).

In the embodiments shown herein the fins 71, 72, 73 of the first heat sink element 70 extend in a transversal direction of the heat sink element, or in other words, in the mounted position of the heat sink element in a direction substantially perpendicular to both the light exit surface 42 and the first further surface 46 of the light guide 4. Alternative embodiments are also feasible in which the fins of the heat sink element extend in any other direction, such as e.g. in the longitudinal direction of the heat sink element or, in other words, parallel to the light exit surface 42 of the light guide 4.

In the embodiments shown herein the first heat sink element 70 extends over the whole area of the surface 762 of the reflective element 76 opposite to the phosphor element 77. Alternative embodiments in which the first heat sink element 70 extends over only a part of the area of the surface 762 of the reflective element 76 opposite to the phosphor element 77 are, however, also feasible. Additional or alternative embodiments are also feasible in which the heat sink also extends over a part or all of the four further surfaces, of which three are denoted 763, 764 and 765 while the fourth is not visible on FIG. 12, of the reflective element 76 extending between the surface 762 of the reflective element 76 facing away from the phosphor element and the surface 761 of the reflective element 76 extending adjacent to the phosphor element 77.

Figure 13:
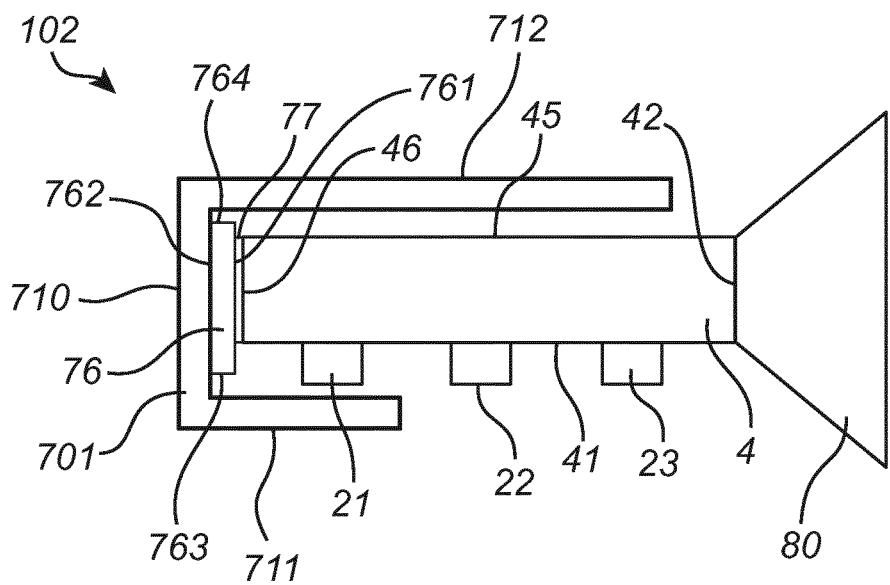
FIG. 13 shows a side view of a third embodiment of a light emitting device according to the invention.

Turning now to FIG. 13, a side view of a third embodiment of a light emitting device 102 according to the invention is shown. The light emitting device 102 comprises an alternative embodiment of a first heat sink element 701, which differs from the first heat sink element 70 shown in FIG. 12 in that it forms a part of an at least partially circumferential outer wall of the light emitting device 102. More particularly, the first heat sink element 701 comprises three parts 710, 711, 712 each forming a part of the at least partially circumferential outer wall of the light emitting device 102. Alternatively, the first heat sink element 701 may comprise one, two or even four parts of the at least partially circumferential outer wall of the light emitting device 102.

The first heat sink element 70 or 701 may furthermore be any one or more of a passively cooled and a liquid cooled heat sink element. Passive cooling may be provided by means of fins such as the fins 71, 72, 73 shown in FIG. 12 and/or by means of an additional air blowing device such as a fan. Liquid cooling may e.g. be provided by providing the first heat sink element 70 or 701 with channels for passage of a cooling liquid.

Figure 14:
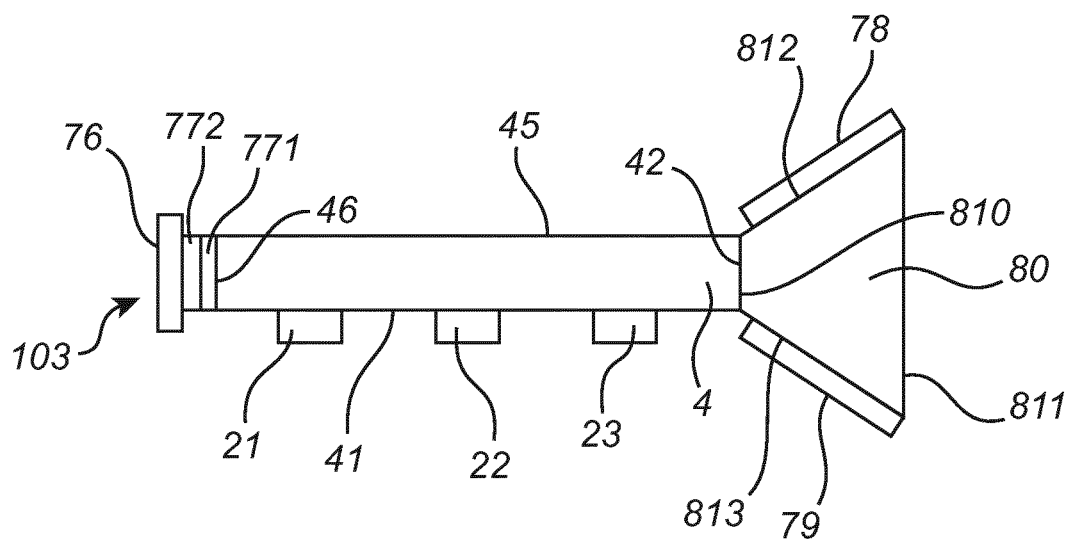
FIG. 14 shows a side view of a fourth embodiment of a light emitting device according to the invention.

Turning now to FIG. 14, a side view of a fourth embodiment of a light emitting device 103 according to the invention is shown. The light emitting device 103 differs from those described above in that it comprises a second heat sink element 78, 79 and two phosphor elements 771, 772.

The second heat sink element 78, 79 is generally arranged on or at a surface 812, 813 of the optical element 80 facing away from and extending adjacent to the light exit surface 42 of the light guide 4. The second heat sink element 78, 79 is in an embodiment not in direct (optical) contact with the optical element 80, but rather arranged with a gap between the second heat sink element and the optical element, the gap being larger than about 1 µm. The gap should not be larger than about 10 µm to ensure good thermal contact.

As shown in FIG. 14 the optical element 80 is of a configuration comprising two surfaces 812, 813 facing away from and extending adjacent to the light exit surface 42 of the light guide 4 and furthermore extending between a surface 810 extending parallel and adjacent to the light exit surface 42 of the light guide 4 and a surface 811 extending parallel and opposite to the surface 810 (cf. also FIG. 9). Hence, the light emitting device 103 also comprises two second heat sink elements 78 and 79.

In the embodiments shown herein the second heat sink elements 78, 79 extend over the whole area of the respective surfaces 812, 813 of the optical element 80 facing away from and extending adjacent to the light exit surface 42 of the light guide 4. Alternative embodiments in which the second heat sink elements 78, 79 extend over only a part of the area of the respective surfaces 812, 813 of the optical element 80 facing away from and extending adjacent to the light exit surface 42 of the light guide 4 are, however, also feasible.

The second heat sink elements 78, 79 may be made of a reflective material. Furthermore, it is also feasible to provide additional heat sink elements on or to provide second heat sink elements extending also over at least a part of the surfaces of the optical element 80 extending between the surfaces 812 and 813.

The two phosphor elements 771, 772 are arranged between the first further surface 46 of the light guide 4 and the reflective element 76. The two phosphor elements 771, 772 are in embodiments provided as different phosphors, i.e. as phosphors adapted for emitting light having mutually different spectral distributions. Thereby a light emitting device 103 with a light output having an even wider spectral distribution may be provided.

Figure 15:
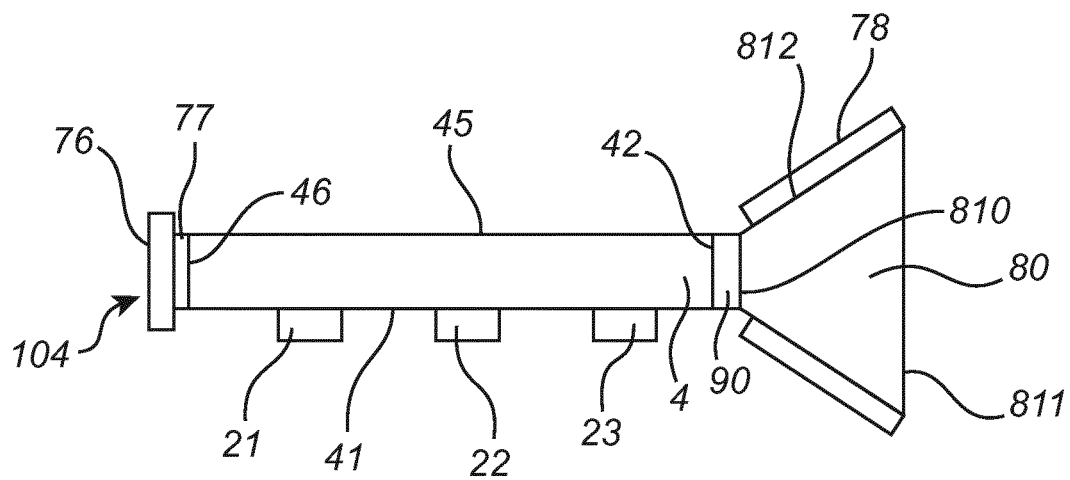
FIG. 15 shows a side view of a fifth embodiment of a light emitting device according to the invention.

Turning now to FIG. 15, a side view of a fifth embodiment of a light emitting device 104 according to the invention is shown. Here, the optical element 80 is of a configuration in which one circumferential surface 812 extends between the mutually opposite surfaces 810 and 811, and consequently one circumferential second heat sink element 78 extends over at least a part of the circumferential surface 812.

Irrespective of the embodiment the second heat sink element 78 may furthermore be any one or more of a passively cooled and a liquid cooled heat sink element. Passive cooling may be provided by means of fins and/or by means of an additional air blowing device such as a fan. Liquid cooling may e.g. be provided by providing the second heat sink element 78 with channels for passage of a cooling liquid.

In embodiments the second heat sink element 78, 79 is non-transparent. In embodiments the second heat sink element 78, 79 is reflective to light but not to heat radiation and/or it comprises a light reflecting coating on the surface facing the optical element 80.

In embodiments the second heat sink element 78, 79 is made of a metal such as copper, iron or aluminum. Irrespective of the embodiment the second heat sink element 78, 79 may also be made of a reflective ceramic such as alumina or boron nitride. In more general terms, suitable materials for such a non-transparent second heat sink element 78, 79 are materials which have a high heat conductivity, i.e. a heat conductivity which is larger than e.g. 1 W/(m*K), and in an embodiment larger than 10 W/(m*K) or even larger than 20 W/(K*m).

The light emitting device 104 shown in FIG. 15 further comprises a second phosphor element 90 arranged between the light exit surface 42 of the light guide 4 and the optical element 80. The phosphor elements 77 and 90 are in embodiments provided as different phosphors, i.e. as phosphors adapted for emitting light having mutually different spectral distributions. Thereby a light emitting device 104 with a light output having an even wider spectral distribution may be provided. According to alternative embodiments, the phosphor elements 77 and 90 are provided as identical phosphors, i.e. as phosphors adapted for emitting light having identical spectral distributions.

Figure 16:
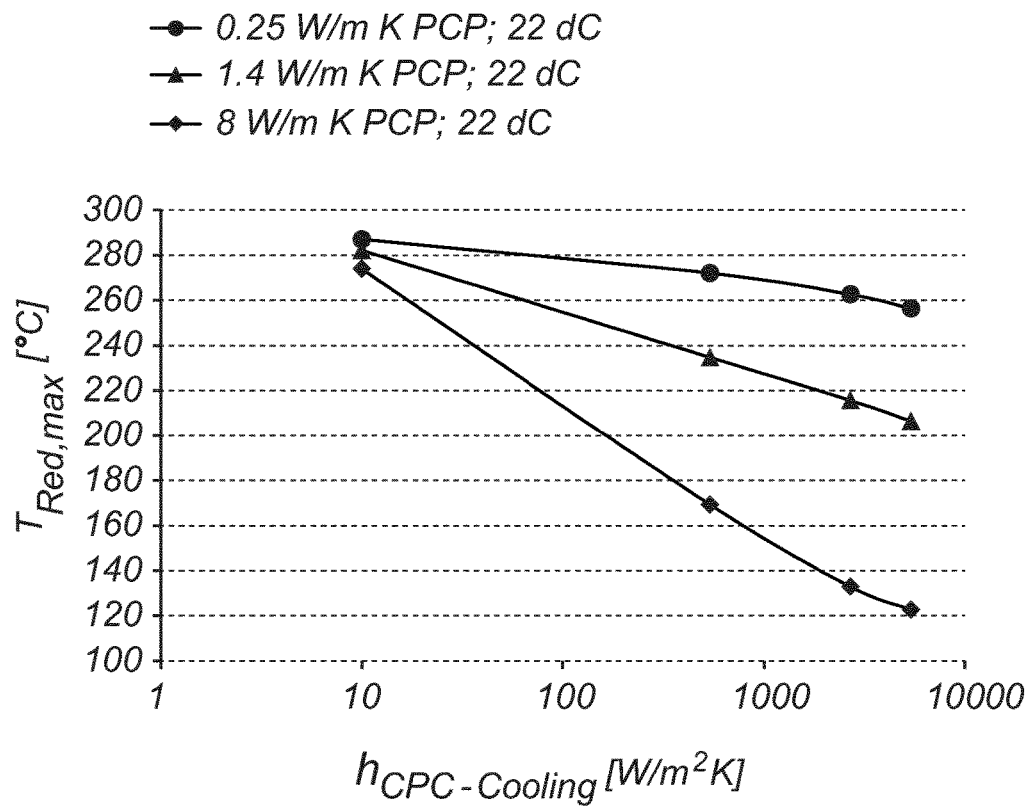
FIG. 16 shows a graph illustrating the cooling effect as reduction in temperature of the phosphor element as a function of the cooling coefficient of the heat sink element for three different light emitting devices according to FIG. 15 with three different lenses as optical elements.

Finally, FIG. 16 shows a graph illustrating the cooling effect in terms of the reduction in temperature of the second phosphor element 90 as a function of the logarithm to the heat transfer coefficient at the exterior of an optical element in the form of a Compound Parabolic Concentrator (CPC), $h_{cpc\_cooling}$, measured in W/m²K of the second heat sink element 78 for three different light emitting devices according to FIG. 15 with four different lenses as optical elements.

By way of example, the second curve from the top, indicated with triangles in FIG. 16, shows the results of measurements performed on a light emitting device according to the invention and with an optical element 80 in the form of a lens made of glass with a thermal conductivity or k-value of 1.4 W/mK and with different second heat sink elements 78, 79 having values of $h_{cpc\_cooling}$ ranging from $h_{cpc\_cooling}=10$ W/m²K to somewhat below $h_{cpc\_cooling}=10,000$ W/m²K. As may be seen a light emitting device provided with such a lens and with e.g. a second heat sink element 78 having $h_{cpc\_cooling}=100$ W/m²K would reduce the temperature of the second phosphor element 90 with 40° C. from 280° C. to 240° C.

Seen from the top, the remaining two curves indicated with circles and diamonds, respectively, show the results of analogous measurements performed on a light emitting device according to the invention and with an optical element 80 in the form of a lens of glass with a thermal conductivity or k-value of 0.25 W/mK and 8 W/mK, respectively.

Figure 17:
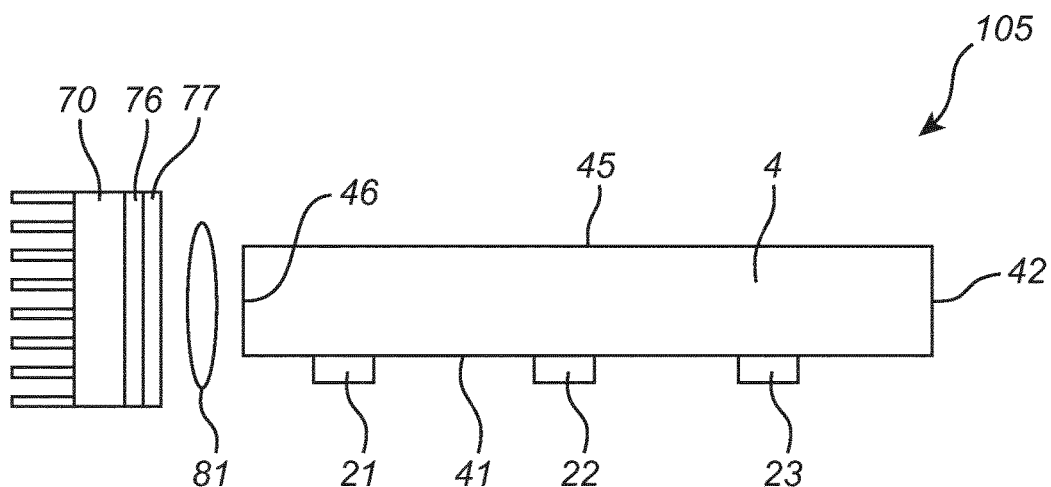
FIG. 17 shows a side view of another embodiment of a light emitting device according to the invention.

Turning now to FIG. 17, a side view of another embodiment of a light emitting device 105 according to the invention is shown. The light emitting device 105 differs from that described above with reference to FIGS. 9 and 10 in that it further comprises a first heat sink element 70 on which the phosphor element 77 is provided. Furthermore, in this embodiment an optical element 81 is provided in between the light guide 4 and the phosphor element 77, however, this optical element is not essential and in other embodiments no optical element is provided. The first heat sink element 70 is generally arranged on or at a surface of the reflective element 76 facing away from the phosphor element 77 and thereby also facing away from the first further surface 46 of the light guide 4. In this embodiment the first heat sink element 70 is arranged adjacent to the reflective element 76 opposite to the phosphor element 77. In another embodiment the phosphor element 77 is arranged on a surface of the heat sink element 70, which surface is reflective, and no separate reflective element is provided.

The first heat sink element 70 is in this embodiment non-transparent and comprises in this case one or more fins for improved heat distribution. It is noted, however, that the fins may in principle be omitted. Further embodiments of the heat sink element 70 are described with reference to FIG. 12.

Furthermore, in this embodiment a gap is provided between the phosphor element 77 and the optical element 81 and another gap is provided between the optical element 81 and the first further surface 46 of the light guide 4. Light exiting the light guide 4 via the first further surface 46 is projected, via the optical element 81, onto and directed to the phosphor element 77, after which it is at least partially converted to another wavelength by the phosphor element 77 and reflected at the reflective element 76 back to the optical element 81 and finally the at least partially converted light is directed into the light guide 4 via the optical element 81 through the first further surface 46. Thus, the light passes the phosphor element 77 and the optical element 18 twice and enters the light guide 4 after being at least partially converted by the phosphor element 77. The separation of the phosphor element 77 from the light guide 4 by a gap improves the thermal management of the light guide 4 because heat generated by the phosphor element 77 will not, or to a lesser extent, be transported to the light guide 4, and, hence, the light guide 4 will experience a lower temperature increase. Also heat generated in the light guide 4 will not, or to a much lesser extent, be transferred to the phosphor element, because the thermal resistance between the phosphor element 77 and the light guide 4 is increased considerably.

In embodiments, the phosphor element 77 comprises regions of different phosphor materials, such as a pixelated phosphor layer, for example a yellow phosphor and a phosphor which converts UV/violet light to blue light. In an embodiment the phosphor element comprises regions comprising a phosphor material and regions comprising a reflective material to enhance the light output exiting from the phosphor element.

In another embodiment (not shown) no optical element is provided and the phosphor element 77 faces the first further surface 46 of the light guide 4. In other words, in this case a gap is provided between the phosphor element 77 and the light guide 4.

The person skilled in the art realizes that the present invention by no means is limited to the embodiments described above. On the contrary, many modifications and variations are possible within the scope of the appended claims.

Particularly, the various elements and features of the various embodiments described herein may be combined freely.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:
1. A light emitting device comprising:
at least one light source adapted for, in operation, emitting first light with a first spectral distribution,
a light guide made of a luminescent material and comprising a light input surface and a light exit surface extending in an angle different from zero to one another, and further comprising a first further surface extending parallel to and arranged opposite to the light exit surface, wherein the light guide is adapted for receiving the first light with the first spectral distribution at the light input surface, converting at least a part of the first light with the first spectral distribution to second light with a second spectral distribution, guiding the second light with the second spectral distribution to the light exit surface and coupling the second light with the second spectral distribution out of the light exit surface, and
a phosphor element arranged adjacent to the first further surface and a reflective element arranged adjacent the phosphor element opposite to the first further surface, wherein the phosphor element is adapted for converting light incident from the light guide to third light with a third spectral distribution,
wherein the light guide furthermore is adapted for receiving the third light with the third spectral distribution at the first further surface, guiding the third light with the third spectral distribution to the light exit surface and coupling the third light with the third spectral distribution out of the light exit surface.

2. A light emitting device according to claim 1, and further comprising an optical element arranged at the light exit surface.

3. A light emitting device according to claim 2, wherein a second heat sink element is provided on the optical element.

4. A light emitting device according to claim 3, wherein the second heat sink element is any one or more of a passively cooled heat sink element, a liquid cooled, heat sink element, a heat sink element comprising one or more fins and a heat sink element comprising a light reflective layer or coating.

5. A light emitting device according to claim 1, wherein the phosphor element has a thickness between 0.1 mm and 1 cm.

6. A light emitting device according to claim 1, wherein the phosphor element and the reflective element are arranged on the first further surface and the phosphor element, respectively.

7. A light emitting device according to claim 1, wherein the light emitting device comprises at least two phosphor elements arranged between the first reflective element and the first further surface.

8. A light emitting device according to claim 1, wherein the phosphor element and the light guide are separated by a gap.

9. A light emitting device according to claim 1, wherein a first heat sink element is provided adjacent to the first reflective element opposite to the phosphor element.

10. A light emitting device according to claim 9, wherein the first heat sink element is any one or more of a passively cooled heat sink element, a liquid cooled heat sink element, a heat sink element comprising one or more fins and a heat sink element forming an outer wall of the light emitting device.

11. A light emitting device according to claim 9, wherein the first heat sink element is arranged in direct contact with the first reflective element or is glued onto the first reflective element or is arranged such that a gap is provided between the first heat sink element and the first reflective element.

12. A light emitting device according to claim 1, wherein the third spectral distribution is in a wavelength range between 590 nm and 850 nm.

13. A light emitting device according to claim 1, wherein the second spectral distribution is in a wavelength range between 495 nm and 590 nm.

14. A light emitting device according to claim 1, wherein the first spectral distribution is in a wavelength range between 350 nm and 550 nm.

15. A lamp, a luminaire, or a lighting system comprising a light emitting device according to any one of the previous claims, the lamp, luminaire and system being used in one or more of the following applications: digital projection, automotive lighting, stage lighting shop lighting, home lighting, accent lighting, spot lighting, theater lighting, fiber optic lighting, display systems, warning lighting systems, medical lighting applications, decorative lighting applications.

* * * * *